United States Patent
Wu et al.

(10) Patent No.: US 9,553,602 B1
(45) Date of Patent: Jan. 24, 2017

(54) METHODS AND SYSTEMS FOR ANALOG-TO-DIGITAL CONVERSION (ADC) USING AN ULTRA SMALL CAPACITOR ARRAY WITH FULL RANGE AND SUB-RANGE MODES

(71) Applicant: Integrated Device Technology, Inc., San Jose, CA (US)

(72) Inventors: I-chang Wu, Fremont, CA (US); Jagdeep Bal, Saratoga, CA (US)

(73) Assignee: Integrated Device Technology, inc., San Jose, CA (US)

( * ) Notice: Subject to any disclaimer, the term of this patent is extended or adjusted under 35 U.S.C. 154(b) by 0 days.

(21) Appl. No.: 15/076,327

(22) Filed: Mar. 21, 2016

(51) Int. Cl.
*H03M 1/12* (2006.01)

(52) U.S. Cl.
CPC .................................... *H03M 1/12* (2013.01)

(58) Field of Classification Search
CPC .......... H03M 1/12; H03M 1/66; H03M 1/747; H03M 1/00; H03M 1/14; H03M 1/001; H03M 1/004; H03M 1/02; H03M 1/10
USPC ........ 341/156, 155, 144, 110, 120, 108, 172
See application file for complete search history.

(56) References Cited

U.S. PATENT DOCUMENTS

| | | | |
|---|---|---|---|
| 5,748,949 A | 5/1998 | Johnston et al. | |
| 6,219,797 B1 | 4/2001 | Liu et al. | |
| 6,643,787 B1 | 11/2003 | Zerbe et al. | |
| 6,959,066 B2 | 10/2005 | Wang et al. | |
| 7,590,163 B1 | 9/2009 | Miller et al. | |
| 7,741,981 B1 * | 6/2010 | Wan | H03M 1/02 341/110 |
| 7,928,880 B2 * | 4/2011 | Tsukamoto | H03M 1/1061 341/144 |
| 8,188,796 B2 | 5/2012 | Zhu et al. | |
| 8,416,107 B1 * | 4/2013 | Wan | H03M 1/1033 341/120 |
| 8,432,231 B2 | 4/2013 | Nelson et al. | |

(Continued)

OTHER PUBLICATIONS

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

*Primary Examiner* — Jean B Jeanglaude
(74) *Attorney, Agent, or Firm* — Kenneth Glass; Mark Peloquin; Glass & Associates

(57) ABSTRACT

Methods and apparatuses are described to convert analog signals to digital signals using a local charge averaging capacitor array (LCACA) in an analog-to-digital converter (ADC.) An apparatus includes a comparator. The comparator is configured with a first high input, a first low input, and is configure to receive a clock signal. A logic/latch block is configured to receive the clock signal and an output from the comparator. The logic/latch block is configured to output a control signal and a digital N-bit output signal. A local charge-averaging capacitor array (LCACA) is configured to receive the control signal and a reference voltage. An output of the LCACA is coupled to the first low input. The first LCACA is divided into a high sub-array and a low sub-array. The high sub-array is pre-charged to a high reference voltage and the low sub-array is pre-charged to a low reference voltage. The high reference voltage is greater than the low reference voltage. In operation, an analog signal is input to the first high input and the digital N-bit output signal is the digital conversion of the analog signal.

20 Claims, 15 Drawing Sheets

(56) References Cited

U.S. PATENT DOCUMENTS

| | | | |
|---|---|---|---|
| 8,436,677 B2* | 5/2013 | Kull | G11O 5/147 327/541 |
| 8,456,155 B2 | 6/2013 | Tamura et al. | |
| 8,471,751 B2* | 6/2013 | Wang | H03M 1/145 327/307 |
| 8,896,476 B2* | 11/2014 | Harpe | H03M 1/02 341/118 |
| 8,933,830 B1* | 1/2015 | Jeon | H03M 1/1071 341/110 |
| 8,981,858 B1 | 3/2015 | Grivna et al. | |
| 9,077,386 B1 | 7/2015 | Holden et al. | |
| 9,100,232 B1 | 8/2015 | Hormati et al. | |
| 2003/0184350 A1 | 10/2003 | Wang et al. | |
| 2006/0103436 A1 | 5/2006 | Saitou et al. | |
| 2006/0119402 A1 | 6/2006 | Thomsen et al. | |
| 2009/0083567 A1 | 3/2009 | Kim et al. | |
| 2009/0184857 A1* | 7/2009 | Furuta | H03M 1/1215 341/156 |
| 2010/0007427 A1 | 1/2010 | Tomita et al. | |
| 2010/0164761 A1* | 7/2010 | Wan | H03M 1/02 341/108 |
| 2010/0240323 A1 | 9/2010 | Qiao et al. | |
| 2011/0032013 A1 | 2/2011 | Nelson et al. | |
| 2011/0095784 A1 | 4/2011 | Behel et al. | |
| 2011/0234204 A1 | 9/2011 | Tamura et al. | |
| 2011/0234433 A1* | 9/2011 | Aruga | H01L 23/5223 341/172 |
| 2011/0304490 A1* | 12/2011 | Janakiraman | H03K 5/2481 341/122 |
| 2012/0013406 A1 | 1/2012 | Zhu et al. | |
| 2012/0200330 A1 | 8/2012 | Kawagoe et al. | |
| 2012/0249207 A1 | 10/2012 | Natsume et al. | |
| 2012/0262315 A1* | 10/2012 | Kapusta | H03M 1/125 341/110 |
| 2012/0297231 A1 | 11/2012 | Qawami et al. | |
| 2013/0002467 A1* | 1/2013 | Wang | H03M 1/145 341/172 |
| 2013/0162454 A1* | 6/2013 | Lin | H03M 1/38 341/120 |
| 2013/0194115 A1* | 8/2013 | Wu | H03M 1/144 341/110 |
| 2013/0300455 A1 | 11/2013 | Thirugnanam et al. | |
| 2015/0213873 A1 | 7/2015 | Ihm et al. | |
| 2016/0084895 A1 | 3/2016 | Imhof | |
| 2016/0119118 A1 | 4/2016 | Shokrollahi | |
| 2016/0162426 A1 | 6/2016 | Benjamin et al. | |
| 2016/0211929 A1 | 7/2016 | Holden et al. | |

\* cited by examiner

FIG 5

| ADC Bits b | Total number of unit capacitors in the LCACA (in both sub-arrays) | Number of unit capacitors in each sub-array of the LCACA $N_b$ | Number of unit capacitors in a conventional binary weighted array |
|---|---|---|---|
| 2 | 4 | 2 | 4 |
| 3 | 6 | 3 | 8 |
| 4 | 10 | 5 | 16 |
| 5 | 16 | 8 | 32 |
| 6 | 24 | 12 | 65 |
| 7 | 36 | 18 | 128 |
| 8 | 54 | 27 | 256 |
| 9 | 82 | 41 | 512 |
| 10 | 124 | 62 | 1024 |
| 11 | 186 | 93 | 2048 |
| 12 | 280 | 140 | 4096 |
| 13 | 420 | 210 | 8192 |
| 14 | 630 | 315 | 16384 |
| 15 | 946 | 473 | 32768 |
| 16 | 1420 | 710 | 65536 |
| 17 | 2130 | 1065 | 131072 |
| 18 | 3196 | 1598 | 262144 |
| 19 | 4794 | 2397 | 524288 |
| 20 | 7192 | 3596 | 1048576 |
| ... | | | |

$b = 2, \ N_2 = 2$ $b > 2, \ N_b = N_{b-1} + \text{Round}(N_{b-1}/2)$

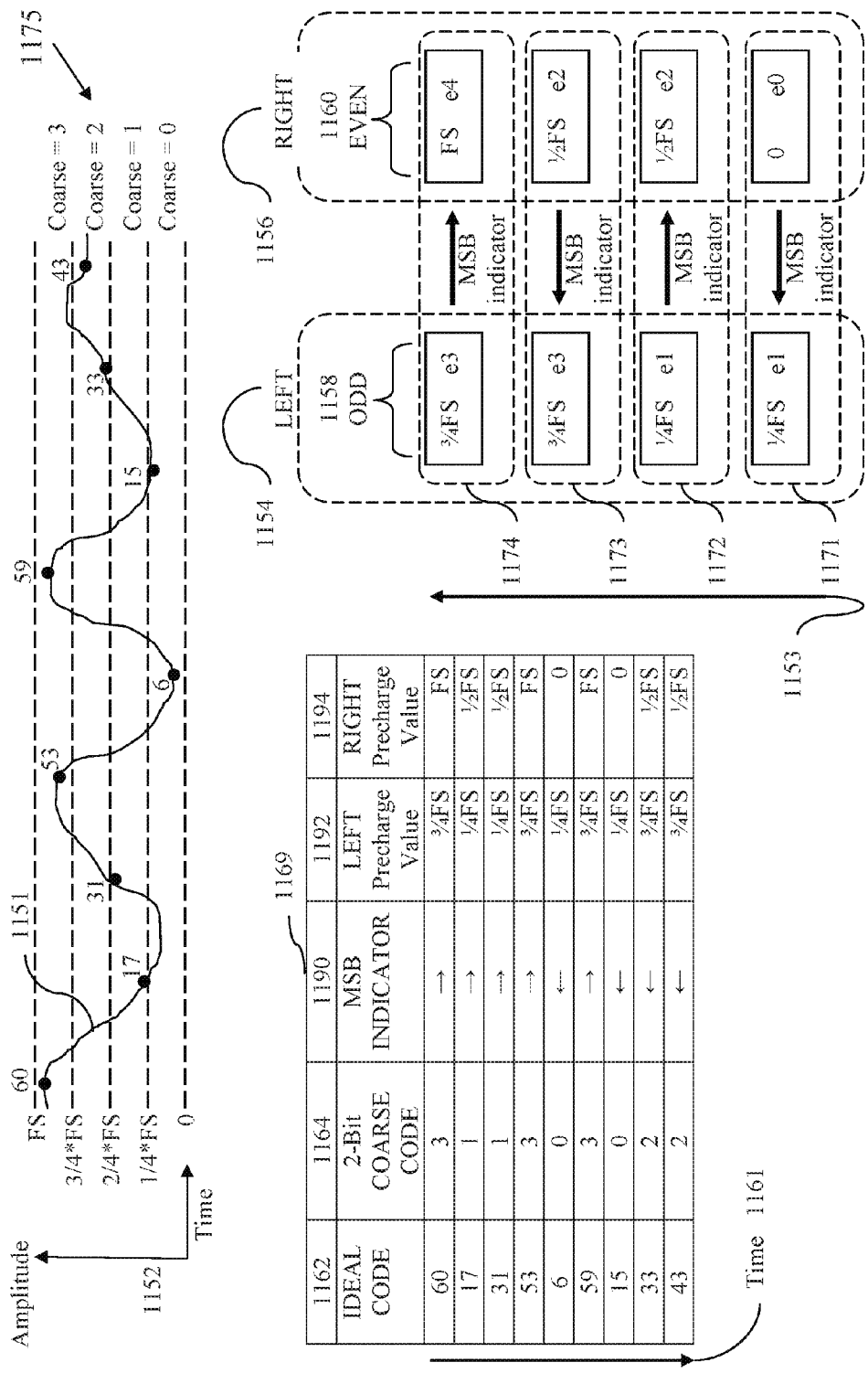

METHODS AND SYSTEMS FOR ANALOG-TO-DIGITAL CONVERSION (ADC) USING AN ULTRA SMALL CAPACITOR ARRAY WITH FULL RANGE AND SUB-RANGE MODES

BACKGROUND OF THE INVENTION

1. Field of Invention

The invention relates generally to analog-to-digital conversion of a signal, and more specifically to apparatuses and methods pertaining to an analog-to-digital converter (ADC) which can span a wide range of input frequency range, i.e., large bandwidth.

2. Art Background

In the field of electronics, signals exist in an analog form or in a digital form. The analog signal is said to have a continuous variation with respect to an independent variable such as time or space, etc. An amplitude of an analog signal typically represents some information of interest. Variation in time is characterized in some cases by sinusoidal variation. The digital signal is characterized in the simplest form as a signal which exists in two states. Zero (0) and one (1) are two states commonly associated with a digital signal. Digital signals can also be configured to take on more than two states and in such cases digital signals are constructed to have a number of states that are a power of 2. A code using the number of desired states in the digital signal is used to encode the digital signal with the information of interest.

Electronic devices such as computers, mobile phones, tablets, network equipment, communication channels, etc. often utilize an analog-to-digital converter (ADC) which converts a signal from the analog form to the digital form. As electronic devices become faster, clock frequencies associated with the systems increase. Increasing clock frequency require an internal clock to operate at higher and higher frequencies, this requirement increases the bandwidth required for an ADC used in the system. Higher ADC bandwidths usually result in increased power consumption. This can present a problem.

Some existing analog-to-digital converters (ADCs) are made to satisfy the Nyquist sampling theorem, thereby providing a sampling clock with a frequency at least twice as large as the highest analog frequency input thereto, sometimes referred to as the Nyquist frequency. Some examples of ADCs which are designed to accomplish Nyquist sampling are known in the art as Flash ADC, Pipelined ADC, SAR (Successive Approximation Register) ADC, Single-slope ADC, Dual-Slope ADC, and Sigma-Delta ADCs. ADCs that use a capacitive array place the capacitive array on the input pin such as an input pin into a comparator, sense amplifier, etc. An example of a SAR ADC is shown in FIG. 1 note that input 102 and 104 are directly in-line with capacitive array 106. FIG. 2 illustrates an example of a Pipelined ADC where capacitor 202 C2 is directly in-line with input 204. Existing capacitive arrays are binary weighted and as such place significant capacitance on the input pin thereby presenting a limitation to the achievable bandwidth of the input analog signals. This can present a problem.

Other ADCs are designed to operate in an under-sampling mode where the clock frequency is less than the Nyquist frequency. In under-sampling mode designs, the high end of the input frequency range of the analog signal can be quite large. For such high-frequency input signals the capacitive loading of the capacitive array becomes the limiting feature for the input signal frequency bandwidth. This can present a problem.

In both Nyquist sampling ADC designs and under-sampling ADC designs when the capacitive array is connected to the input pin of an ADC the bandwidth is reduced, especially with high precision ADCs, i.e., ADCs with a large number of bits, e.g., 8, 12, 24 bit, etc. There are tradeoffs between resolution, speed, silicon size, and power consumption (high precision ADCs need many bits, and the unit capacitor should be large enough to ensure low noise and acceptably small mismatch). Meeting these criteria result in very large capacitive loading on the input pins. Large capacitive loading results in lower bandwidth, longer processing time, and larger power consumption. All of which can present a problem.

SUMMARY

In one or more embodiments, an apparatus includes a comparator. The comparator is configured with a first high input, a first low input, and is configure to receive a clock signal. The logic/latch block is configured to receive the clock signal and an output from the comparator. The logic/latch block is configured to output a control signal and a digital N-bit output signal. A first local charge-averaging capacitor array (LCACA) is configured to receive the control signal and a reference voltage. An output of the first LCACA is coupled to the first low input. The first LCACA is divided into a high sub-array and a low sub-array. The high sub-array is pre-charged to a high reference voltage and the low sub-array is pre-charged to a low reference voltage. The high reference voltage is greater than the low reference voltage. In operation, an analog signal is input to the first high input and the digital N-bit output signal is the digital conversion of the analog signal.

In one or more embodiments, in operation the logic/latch block provides control signals to the first LCACA array and computes Vq for N cycles before outputting the digital N-bit output signal.

In one or more embodiments, the clock signal is an internal clock signal formed using a replica circuit of an LCACA charging state and an internal signal from the comparator.

In one or more embodiments, the LCACA is structured according to a number of bits "b" required in the analog-to-digital conversion as follows:

$$b=2, N_2=2;$$

$$b>2, N_b=\text{Round}(N_{b-1}/2);$$

$$n=1, K_1(b)=\text{Round}(N_{b-1}/2); \text{ and}$$

$$n>1, K_n(b)=K_{n-1}(b-1).$$

In one or more embodiments, the comparator is configured with a differential input; the comparator further includes a second high input and a second low input. An analog differential signal is input to the first high input and the second low input. A second local charge-averaging capacitor array (LCACA) is configured to receive a second control signal from the logic/latch bloc and a second reference voltage. An output of the second LCACA is coupled to the second high input. In operation, the analog differential signal is input to the comparator and the digital N-bit output signal is a digital conversion of the analog differential signal.

In one or more embodiments, the clock signal is designed to sample the analog input signal at a frequency sufficient to satisfy the Nyquist condition.

In one or more embodiments, the clock signal is designed to sample the analog input signal at a frequency below the Nyquist condition.

In one or more embodiments, the clock signal is sufficiently high to accommodate a bandwidth of multiple Gigahertz for the analog input signal.

In one or more embodiments, an apparatus includes an M-bit analog-to-digital converter (ADC). The M-Bit ADC is configured to receive an input analog signal, a residue voltage, and at least one reference voltage and to assign the analog input signal to a first section of an M-bit digital output signal having $2^M$ sections. An N-bit analog-to-digital converter (ADC) is configured to receive as an input the residue voltage and the at least one reference voltage. The N-bit ADC converter further includes a comparator. The comparator is configured to receive the output signal on a first high input. The comparator has a first low input, and the comparator is configured to receive a clock signal. A logic/latch block is configured to receive the clock signal and an output signal from the comparator. The logic/latch block is configured to output a control signal and a digital N-bit output signal. A local charge-averaging capacitor array (LCACA) is configured to receive the residue voltage and the at least one reference voltage. An output signal of the LCACA is coupled to the first low input. The LCACA is divided into a left sub-array and a right sub-array. The left sub-array and the right sub-array are pre-charged to different voltages in a predefined order according to section number. In operation, the output signal of the LCACA is input on the first high input and the digital conversion of the analog signal contains M+N bits.

In one or more embodiments, in sub-ranging mode the M-bit ADC is disabled. The input to the N-bit ADC and the reference voltages are provided by a previous stage.

In one or more embodiments, the clock signal is an internal clock signal formed using a replica circuit of the LCACA charging state and an internal signal from the comparator.

In one or more embodiments, a sense amplifier is used in the comparator.

In one or more embodiments, a method to obtain Vq uses a local charge averaging capacitive array (LCACA). The steps are performed in order and include: (1) pre-charging a left sub-array of the local charge-averaging capacitor array (LCACA) to a first voltage; (2) pre-charging a right sub-array of the local charge-averaging capacitor array (LCACA) to a second voltage, wherein the first voltage is greater than the second voltage; and (3) combining in parallel K1 capacitors [CH(0)~CH(K1)] from the high sub-array (currently the left sub-array) and K1 capacitors [CL(0)~CL(1)] from the low sub-array (currently the right sub-array) to obtain Vq(n) for n=1.

In one or more embodiments, Vi is output from a separate M-bit analog-to-digital converter (ADC).

In one or more embodiments, once the method ends, the method continues by pre-charging the right sub-array to a fourth voltage, and pre-charging the left sub-array to a third voltage where the third voltage is equal to the second voltage and the fourth voltage is greater than the third voltage.

In one or more embodiments, the digital output is M+N bits wide.

Logic is implemented in an integrated circuit. The logic performs in order the steps 1, 2, 3, and 4, which include: (1) pre-charging means for pre-charging a left sub-array of a local charge-averaging capacitor array (LCACA) to a first voltage and for pre-charging a right sub-array of the local charge-averaging capacitor array (LCACA) to a second voltage, wherein the second voltage is greater than the first voltage; (2) means for selecting a first number of capacitors from the LCACA to produce an average voltage; (3) means for analyzing an output of a comparator in response to the average voltage; and (4) means for determining whether to execute 1 again at different pre-charge voltages and to execute 2 again with a second number of capacitors or to END.

In one or more embodiments, the logic further includes means for reversing a most significant bit (MSB) direction after each pre-charge cycle.

In one or more embodiments, the logic further includes means for producing a digital output from the LCACA.

In one or more embodiments, a representation of logic to convert an input analog signal into a digital signal the representation of logic to perform in order the steps 1, 2, 3, and 4 includes: (1) pre-charging means for pre-charging a least significant bit (LSB) sub-array of a local charge-averaging capacitor array (LCACA) to a first voltage and for pre-charging a most significant bit (MSB) sub-array of the local charge-averaging capacitor array (LCACA) to a second voltage, wherein the second voltage is greater than the first voltage; (2) means for selecting a first number of capacitors from the LCACA to produce an average voltage; (3) means for analyzing an output of a comparator in response to the average voltage; and (4) means for determining whether to execute 2 again with a second number of capacitors or to END.

In one or more embodiments, the representation is embedded in a medium selected from the group consisting of paper and a non-transitory storage medium.

In one or more embodiments, means for ordering a most significant bit (MSB) direction in the LCACA is based on a section number associated with the input analog signal.

In one or more embodiments, the representation of logic further includes means for producing a digital output from the LCACA.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 5 illustrates an illustration of a number of different local charge averaging capacitor arrays (LCACAs), according to embodiments of the invention, against the corresponding conventional binary weighted capacitor arrays.

FIG. 11C illustrates Gap-less pre-charge most significant bit (MSB) direction capacitive array swapping with a 2-bit (M=2) coarse ADC example, according to further embodiments of the invention.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

An analog-to-digital converter utilizing a local charge averaging capacitive array (LCACA) is described. Embodiments of the invention can be used to create a low power very high bandwidth ADC capable of digitizing input analog signals in the Gigahertz range.

Figure 1:
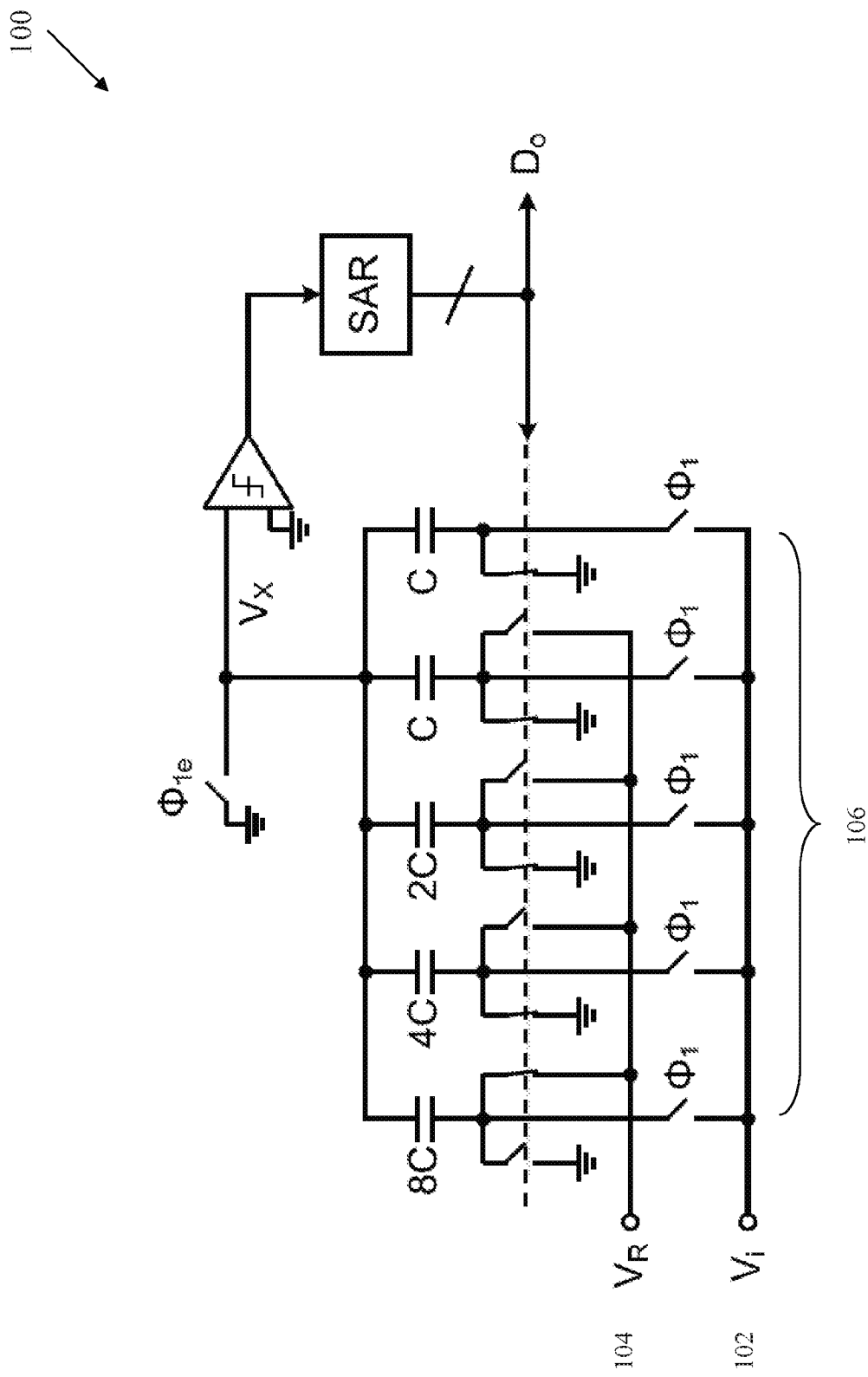
FIG. 1 illustrates an existing SAR (Successive Approximation Register) ADC.
Figure 2:
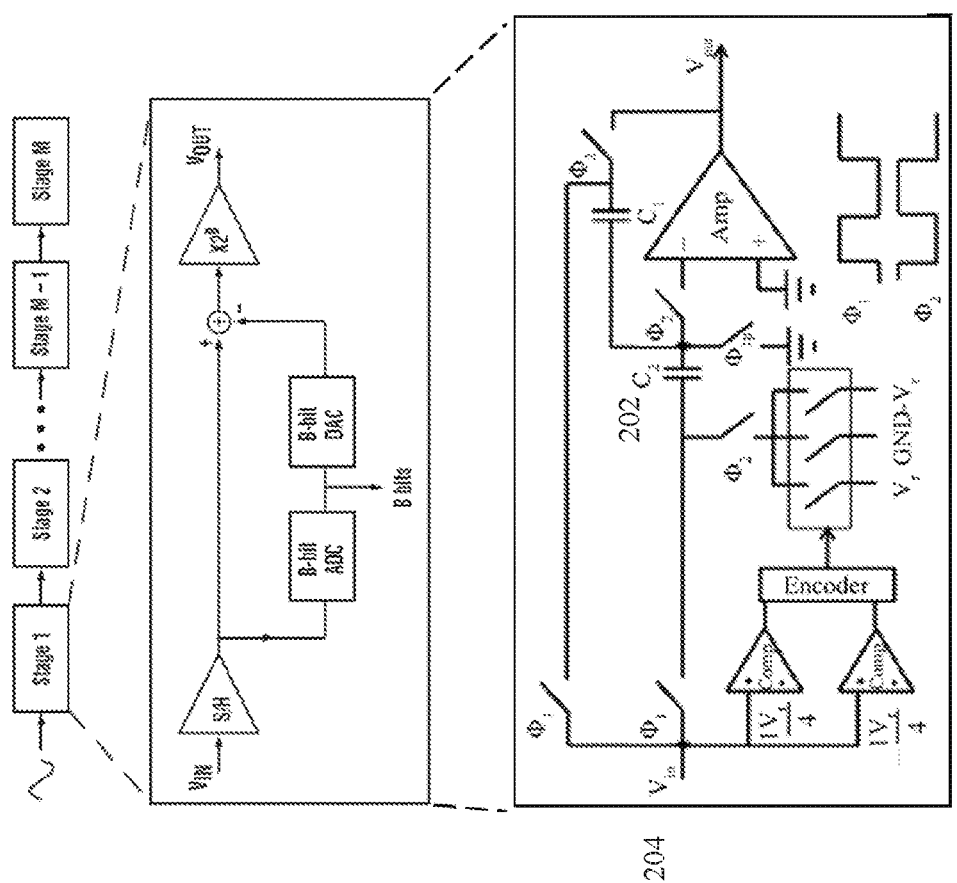
FIG. 2 illustrates an existing Pipelined ADC.
Figure 3:
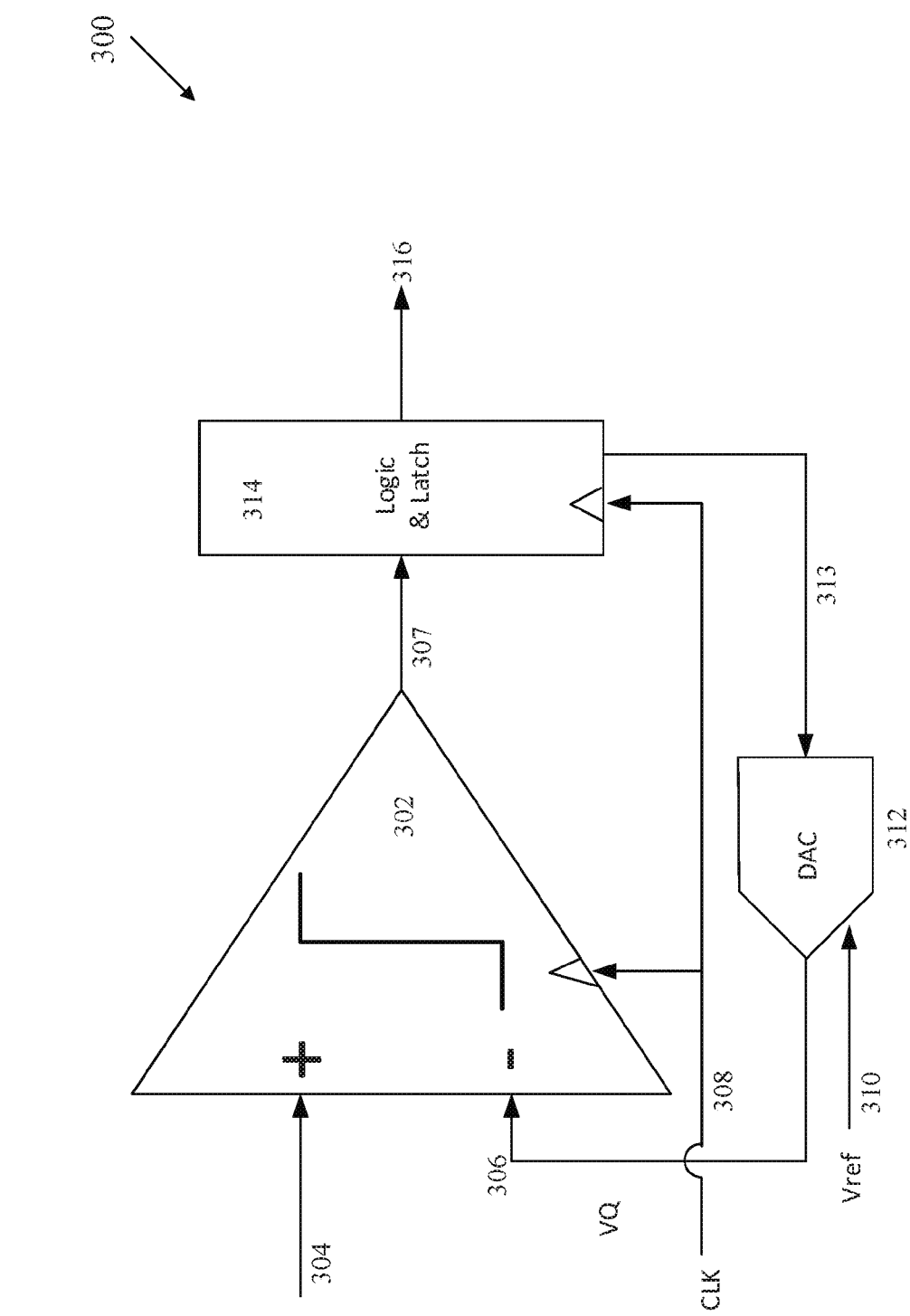
FIG. 3 illustrates a high level ADC architecture suitable for processing single-ended input analog signals, according to embodiments of the invention.

FIG. 3 illustrates, generally at 300, a high level ADC architecture suitable for processing single-ended analog input signals, according to embodiments of the invention. With reference to FIG. 3, the ADC 300 has a comparator 302 which has a input 304 into which analog signals represented by VI are input. A logic/latch block 314 receives an output 307 from the comparator 302. Control signals 313 are output from the logic/latch block 314 and are input into a digital-to-analog converter (DAC) 312. The DAC 312 outputs a comparison voltage at 306 indicated by VQ which is input into a low input of the comparator 302. A reference voltage is provided to DAC 312 at 310. An internal clock signal 308 is provided to the comparator 302, the logic/latch block 314, and the DAC 312. In various embodiments, a sense amplifier is used for the comparator 302. The internal clock signal 308 is described more fully in conjunction with FIG. 8 below.

The DAC 312 includes a local charge averaging capacitive array (LCACA) which will be described in more detail with the figures that follow. The architecture presented in FIG. 3 moves the capacitive array out of the direct path of the analog signals which are input into the input 304. Removing the capacitive array from the input 304 removes the restriction presented by prior art architecture, thereby increasing the bandwidth of the circuit which allows the ADC to operate in the gigahertz range of clock frequency. The local charge averaging capacitive array (LCACA) dramatically lowers the capacitive loading on the input 304 to the comparator 302 thus allowing high-frequency signal input VI. Benefits are realized in all sampling modes, e.g., under-sampling mode, Nyquist sampling mode, and over sampling modes.

In overview, during operation, analog signals VI are input at 304 and are compared with the comparison voltage 306 by the comparator 302. If VI is greater than VQ the comparator outputs a high signal, e.g. "1" at 307. If VI is less than VQ then the comparator 302 outputs a "0" at 307. Based on the output 307 of the comparator 302 the logic/latch block 314 provides control signals to the DAC 312 which cause the comparison voltage VQ to be adjusted with each internal clock cycle "n" until the analog signal is digitized according to the number of design bits in DAC 312. For an N=5 bit design, five clock cycles would be required to digitize the analog input signal, i.e., $1 \le n \le 5$, where n represents a counter for the clock cycles. The digital conversion of the input analog signal is output at 316.

Figure 4:
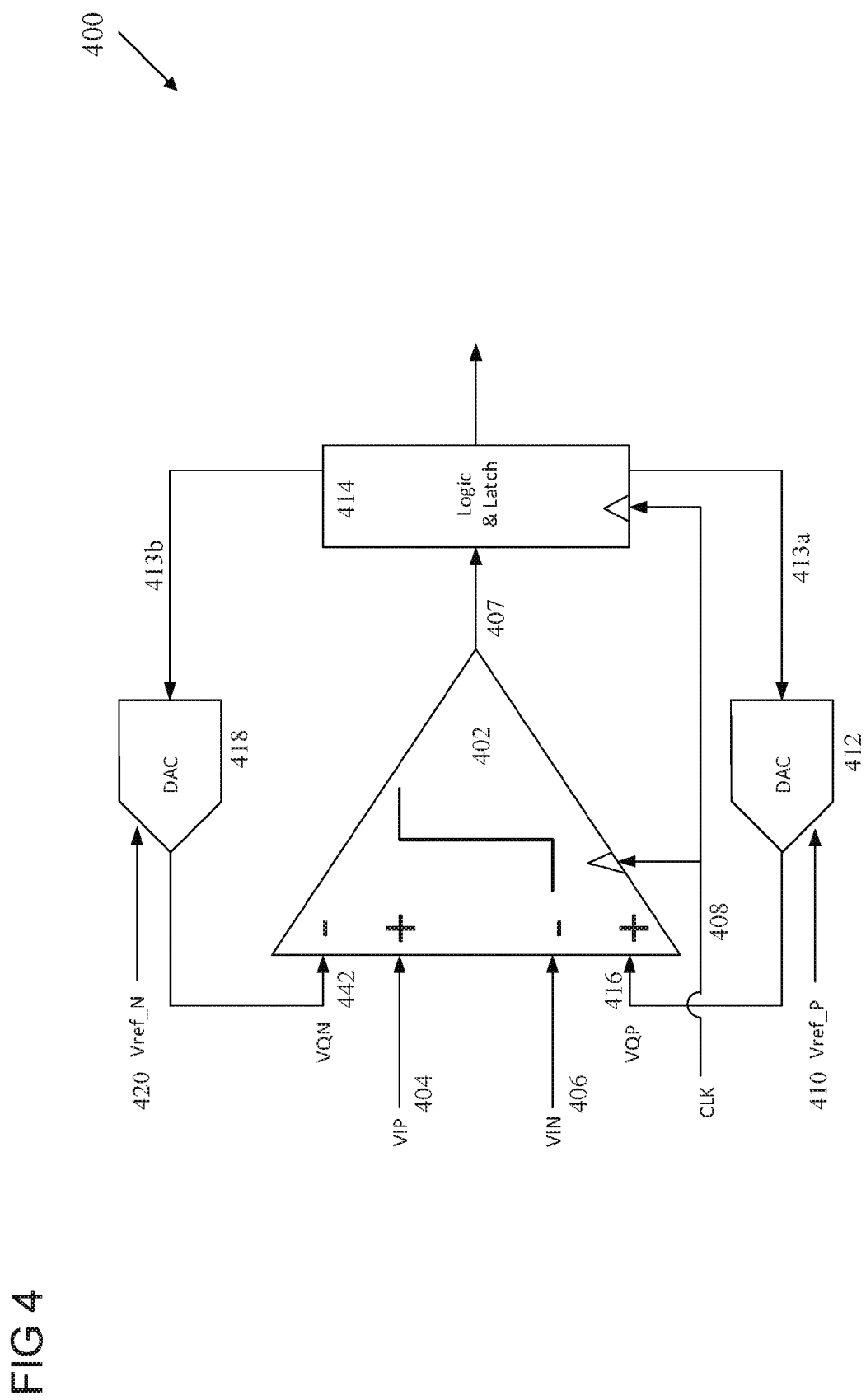
FIG. 4 illustrates a high level ADC architecture suitable for processing differential input analog signals, according to embodiments of the invention.

FIG. 4 illustrates, generally at 400, a high level schematic of ADC architecture suitable for processing differential analog input signals, according to embodiments of the invention. With reference to FIG. 4, a comparator 402 is configured with a differential input 404/406. The comparator 402 has a first high input 404, a second low input 406. A differential analog signal VIP/VIN is input across 404/406. A first low input 422 provides a first comparison voltage VQN which is output from a DAC 418 into the comparator 402. The comparator 402 includes a second high input 416. The second high input 416 provides a second comparison voltage VQP which is output from a DAC 412. The DAC 418 receives a reference voltage 420. An output 407 of the comparator 402 is input into a logic/latch block 414.

The logic/latch block 414 provides control signals 413a to DAC 412 and control signals 413b to DAC 418. The DAC 412 receives a reference voltage 410. An internal clock signal is provided at 408. In one embodiment, the comparator 402 provides an output responsive to a comparison between the signal input on 404 & 406 with VQP & VQN. A "1" is output at 407 if [VI−VQ]>0, where VI=[VIP−VIN] and comparison voltage VQ=[VQP−VQN]. The comparator 402 outputs a "0" at 407 if [VI−VQ]<0.

In overview, during operation, differential analog signal VIP VIN is input at 404/406 where [VIP−VIN] is compared with the comparison voltage [VQP−VQN]. Based on the output 407 of the comparator 402 the logic/latch block 414 provides control signals 413b to the DAC 418 and 413a to DAC 412 which cause the comparison voltage [VQP−VQN] to be adjusted with each internal clock cycle "n" until the analog signal is digitized according to the number of design bits in DAC 412 and DAC 418. For an N=5 bit design, five internal clock cycles would be required to digitize the analog signal, i.e., $1 \le n \le 5$, where n represents a counter for the internal clock cycles.

The DACs 412 and 418 include a local charge averaging capacitive array (LCACA) which will be described in more detail with the figures that follow. The architecture presented in FIG. 4 moves the capacitive array out of the direct path of the differential signals which are input at 404/406.

Removing the capacitive array from the high input 404 removes the restriction presented by prior art architecture, thereby increasing the bandwidth of the circuit which allows the ADC to operate in the gigahertz range of clock frequency. The local charge averaging capacitive array (LCACA) dramatically lowers the capacitive loading on the input 404 to the comparator 402 thus allowing high-frequency signal input VI. Benefits are realized in all sampling modes, e.g., under-sampling mode, Nyquist sampling mode, and over sampling modes.

In various embodiments, the circuit shown in FIG. 3 at 300 or the circuit shown in FIG. 4 at 400 is implemented in an integrated circuit device, which may include an integrated circuit package containing the integrated circuit. In some embodiments, the circuit(s) is implemented in a single integrated circuit die. In other embodiments, the circuit(s) is implemented in more than one integrated circuit die of an integrated circuit device which may include a multi-chip package containing the integrated circuit. The embodiments of the present invention are not limited to any particular semiconductor manufacturing technology. Embodiments of the present invention can be implemented using C-MOS, BIPOLAR, Silicon Germanium, or other process technology. The process technologies listed here are provided merely for example and do not limit embodiments of the invention.

FIG. 5 illustrates, generally at 500, an illustration of a number of different local charge averaging capacitor arrays (LCACAs), according to embodiments of the invention, against the corresponding conventional binary weighted capacitor arrays. With respect to FIG. 5, a comparison is shown in the table where column 502 shows the number of bits that the ADC will quantize the analog signal to. Column 504 shows the number of capacitors on both sides of the local charge averaging capacitor array (LCACA). Column 506 shows the number of capacitors (indicated by $N_b$) on each side of the LCACA. The left side of an LCACA is referred to herein as a left sub-array and the right hand side of the LCACA is referred to herein as the right sub-array. Reference to right and left sub-arrays is important because the unit capacitors used in the LCACA have different absolute capacitance values associated therewith because of the tolerance associated with making real parts. Therefore, in order to provide a monotonically increasing output from the ADC a technique for swapping the most significant bit (MSB) direction will be described below in conjunction with the figures that follow. At this juncture, it is sufficient for the description to distinguish the left sub-array from the right sub-array within the LCACA. Referring back to the table in FIG. 5, column 508 shows the number of unit capacitors needed in a conventional binary weighted capacitor array.

Notably, for any number of desired bits in an ADC design greater than 2 (row 510); the LCACA provides a capacitor array with a greatly reduced number of unit capacitors. For example, row 512 a design for a 20 bit ADC requires an LCACA capacitor array with a total of 7,192 unit capacitors as compared with 1,048,576 capacitors in a conventional binary weighted capacitor array. For the 20 bit case the LCACA array realizes a reduction in array size of 99.3% which is approximately two orders of magnitude. Herein, is illustrated the circuit architecture which removes the bottleneck from the bandwidth on the input signal in an ADC. The generating equations for the number of capacitors needed for each sub-array (column 506) of an LCACA as a function of the number of bits "b" (column 502) in an LCACA ADC design are given by equations 520 for b=2 bits and 522 for b>2 bits. Row 514 indicates a general number of bits b and the corresponding number of capacitors is calculated with equation 522. Note that column 504 is obtained by doubling the number of capacitors shown in column 506 since the right and left capacitor sub-arrays have the same number of capacitors in each sub-array. Reduction in; (1) the capacitance on the input pin of the ADC and reduction in; (2) the total capacitance of the LCACA relative to conventional binary weighted capacitor array, both combine to permit the internal clock frequency to operate in the Gigahertz frequency range and as well to digitize input analog signals in the Gigahertz frequency range.

Figure 6:
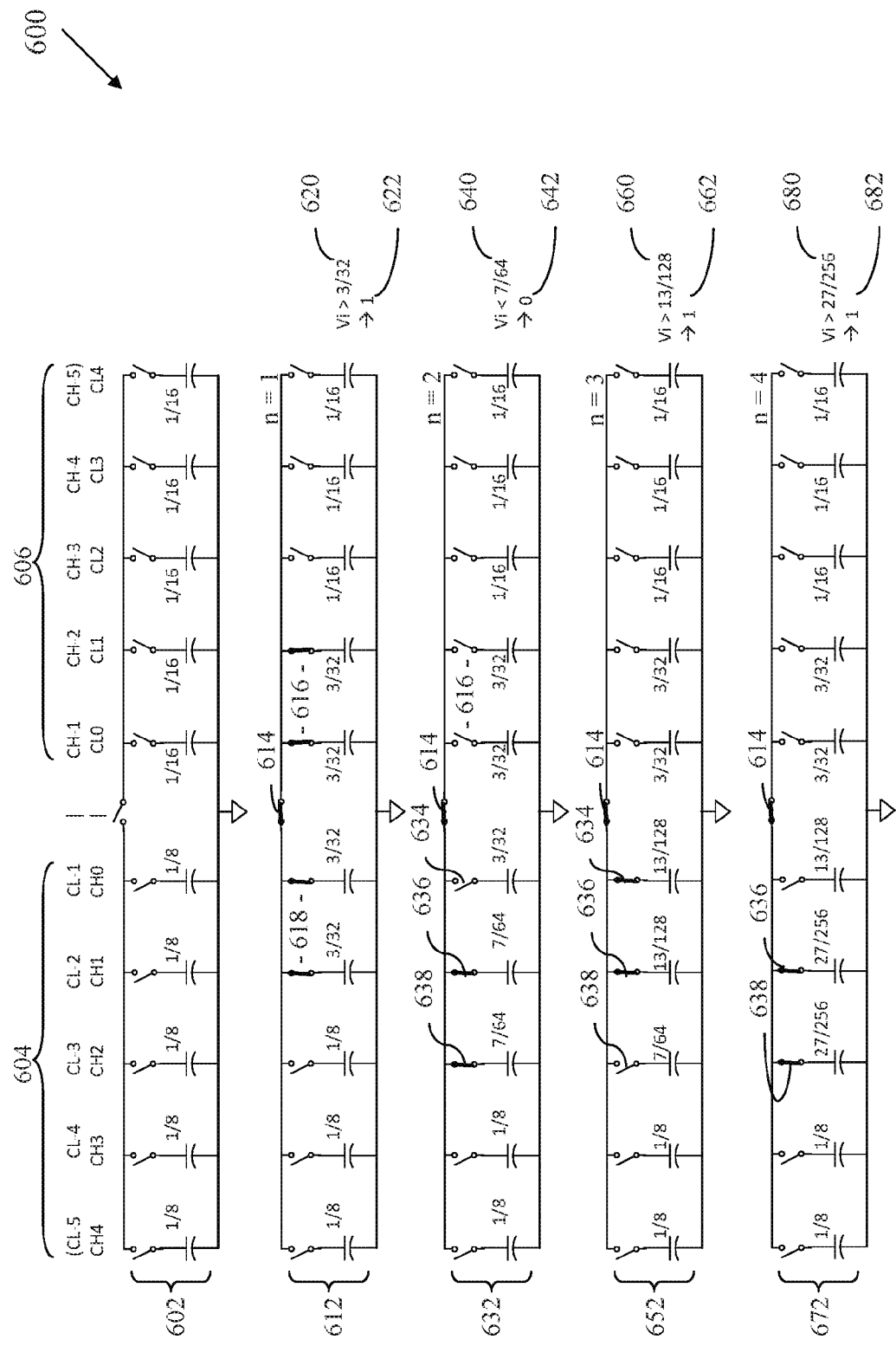
FIG. 6 illustrates the algorithm of FIG. 7A and FIG. 7B applied to a 4-bit case, according to embodiments of the invention.
Figure 7A:
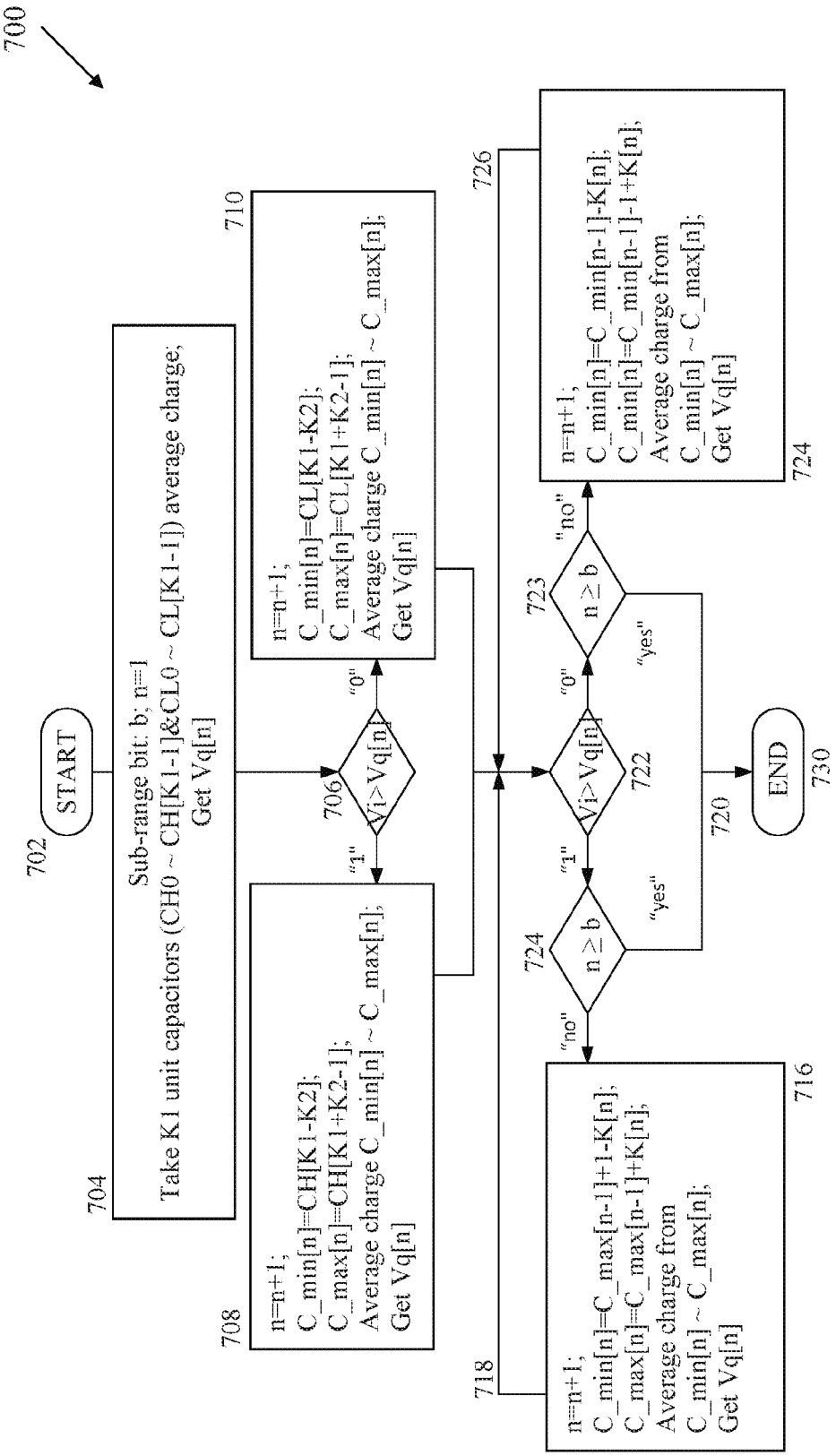
FIG. 7A illustrates a flow chart representation of an algorithm implementing a local charge averaging approach for analog-to-digital conversion used in conjunction with a local charge averaging capacitor array (LCACA), according to embodiments of the invention.
Figure 7B:
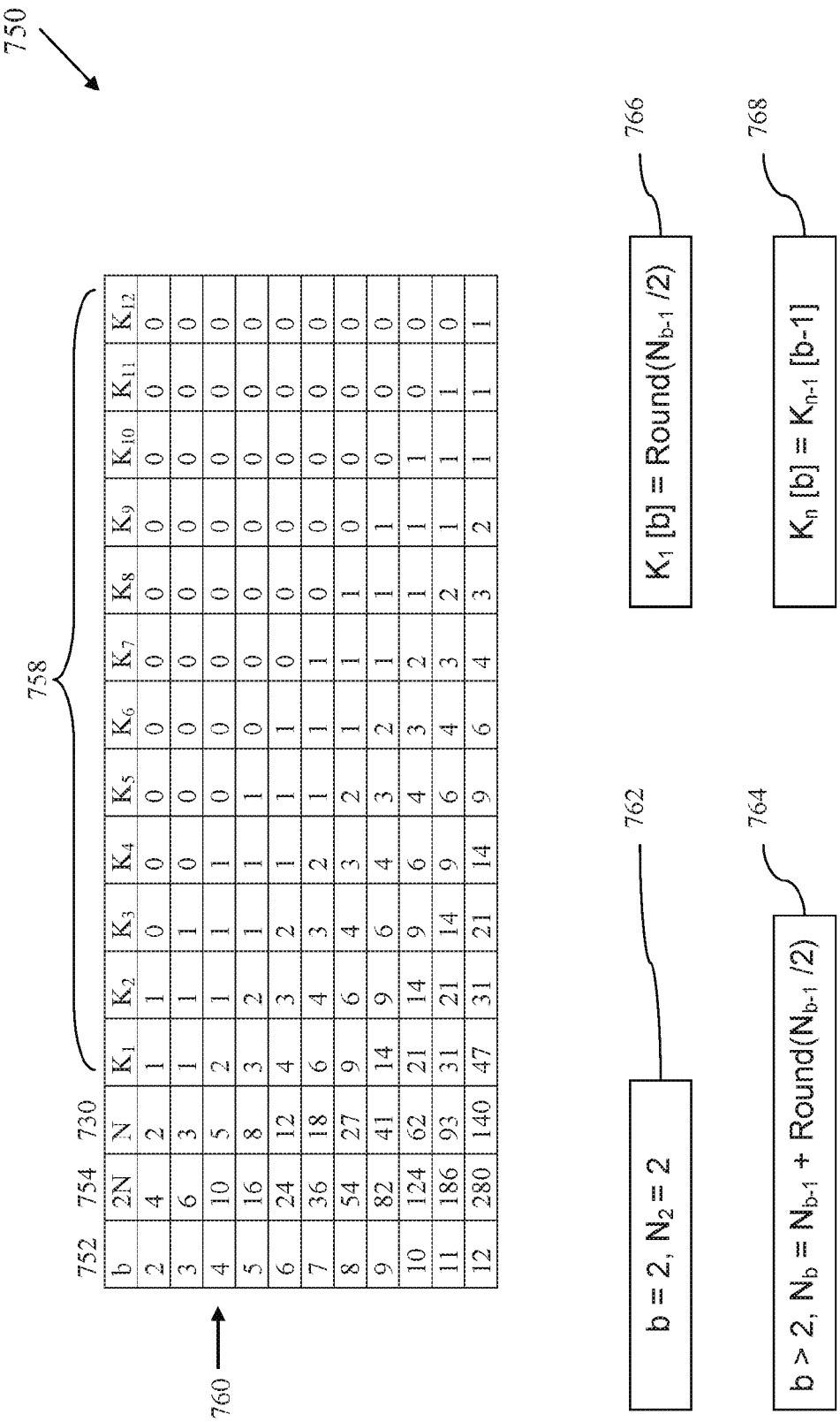
FIG. 7B illustrates coefficients $K_n(b)$ as a function of the number of bits "b" in the analog-to-digital conversion process for the Algorithm of FIG. 7A, according to embodiments of the invention.

FIG. 6 illustrates, generally at 600, the algorithm of FIG. 7A and FIG. 7B applied to a 4 bit case, according to embodiments of the invention. Referring to FIG. 6, a local charge averaging capacitor array (LCACA) is indicated at 602. The LCACA 602 includes a left sub-array 604 and a right sub-array 606. Following the architecture illustrated in FIG. 5, for a 4 bit ADC architecture (b=4) a total of 10 unit capacitors are used with 5 in the left sub-array 604 and 5 in the right sub-array 606.

The LCACA is illustrated 5 times in FIG. 6. The initial pre-charge state is illustrated at 602. In this initial pre-charge state, the left capacitor array 604 is pre-charged to a value of ⅛. The right sub-array 606 is pre-charged to a value of 1/16. Following the initial pre-charge shown in 602 the logic/latch block, previously described, sends control signals to the LCACA which closes switches 614, 616, and 618. In the first internal clock cycle, n=1, closing switches 614, 616, and 618 places unit capacitors CL0, CL1, CH0, and CH1 in parallel which causes the charge between ⅛ and 1/16 to be averaged resulting in a new value 3/32 as illustrated in 612. The output of the LCACA is equivalent, in one embodiment, to VQ (FIG. 3) which is input into a comparator (such as 302 in FIG. 3). In this case, VI is compared against 3/32 at 620. VI is greater than 3/32 as indicated at 622 with the value "1."

In the next clock cycle, n=2, the LCACA is configured as shown at 632. In 632, switches 634 and 616 are opened. Switches 636 and 614 remain closed and switch 638 is closed resulting in an average of charge equal to 7/64. 7/64 is the average between ⅛ and 3/32. Capacitors CH2 and CH1 were closed because the MSB indicator was "1" following the comparison performed at 620. The comparison at 620 indicated that Vq is not high enough thus capacitors CH1 and CH2 were closed rather than close switches CL1 and CL2. The Vq value of 7/64 is compared against Vi at 640. In this case Vi<7/64, the output of the comparator is "0" as shown at 642.

In the next clock cycle, n=3, the LCACA is configured as shown at 652. In 652, switch 638 is opened. Switches 636 and 614 remain closed and switch 634 is closed resulting in an average of charge equal to 13/128. 13/128 is the average between 7/64 and 3/32. Capacitors CH1 and CH0 were closed because the MSB indicator was "0" following the comparison performed at 640. The comparison at 640 indicated that Vi was less than Vq (7/64), thus capacitors CH1 and CH0 were closed rather than close switches CH2 and CH3 had the output of the comparator been different at 642. In 652, the Vq value of 13/128 is compared against Vi at 660. In this case, Vi>13/128, the output of the comparator is "1" as shown at 662. The result from the comparator at 660 moves the process up (to the left) rather than down (to the right) at 672 by opening switch 634 and closing switch 638. The Vq that results at 672 has a value of 27/256 which is the average between 7/64 and 13/128. Vi is compared for the last time with 27/256 at 680, the output of the comparator is "1" at 682 resulting in the binary code of 1011.

FIG. 7A illustrates, generally at 700, a flow chart representation of an algorithm implementing a local charge averaging approach for analog-to-digital conversion used in conjunction with a local charge averaging capacitor array (LCACA), according to embodiments of the invention. FIG. 7B illustrates coefficients $K_n(b)$ as a function of the number of bits "b" in the analog-to-digital conversion process for the Algorithm of FIG. 7A, according to embodiments of the invention.

Referring to FIG. 7A and FIG. 7B, the flow chart 700 provides a general framework for designing the functionality of the logic embodied in the logic/latch block as shown in 314 (FIG. 3) or the logic/latch block as shown in 414 (FIG. 4).

The process starts at a block 702. At a block 704 sub-range bit m corresponds to a particular sub-range established by a coarse ADC with M-bits of quantization which will be described below in more detail under 2-level architecture. In other embodiments, such as single-level architecture, which eliminate the coarse ADC, m would not appear in block 704. Block 704 is read in conjunction with the table at 750 for the values of $K_n$ (where n=integer in the range of 14) corresponding to b=4 bits (row 760) at columns 758, where K1=2, K2=1, and K3=1, and K4=1. As used in this description of embodiments, the symbol "~" used between two variables such as A1~A5 means all element A1, A2, A3, A4, and A5 inclusive.

Evaluating block 704, for n=1, capacitors CH0 through CH1 are charged along with capacitors CL0 through CL1 (corresponding to switches 614, 616, and 618 closed as shown at 612 in FIG. 6). Get Vq(1) results in 3/32 as shown at 620, where 3/32 is the average between 1/8 and 3/32. The value of Vq(1) (3/32) is compared with Vi at 706 (620 in FIG. 6) resulting in a comparator output of "1" (622 FIG. 6) transferring control to a block 708.

Evaluating block 708 for n=2. C_min(2)=CH(K1−K2)=CH(3−2)=CH1. C_max(2)=CH(K1+K2−1)=CH(2+1−1)=CH2. This result corresponds to closing switches 638 and 636 as shown in at 632 (FIG. 6). Get Vq(2) results in 7/64 as shown at 640 FIG. 6, where 7/64 is the average between 1/8 and 3/32. Control transfers at 722 and the value of Vq(2) (7/64) is compared to Vi at a block 722 resulting in a comparator output of "0" (642 in FIG. 6). With Vi<7/64 as shown at 640 FIG. 6, control is transferred to a block 723 where n is compared against b. 2<4 therefore control transfers to a block 724.

Evaluating block 724 for n=3. C_min(3)=C_min(2)−K3=CH1−1=CH0. C_max(3)=C_min(2)−1+1=CH1−1=1=CH1. This result closes switches 634 and 636. Control transfers at 726 to the block 722 where the value of Vq(3) (13/128) is compared to Vi at a block 722 (660 in FIG. 6), where 13/128 is the average between 7/64 and 3/32, resulting in a comparator output of "1" (662 in FIG. 6). Control is transferred to a block 724 (3<4) which transfers control to 716.

Evaluating block 716 for n=4. C_min(4)=C_max(3)+1−K3=CH1+1−1=CH1  C_max(4)=C_max(3)+K3=CH1+1=CH2. This result closes switches 636 and 638 while opening switch 634. Control transfers at 718 to the block 722 where the value of Vq(4) (27/256) is compared to Vi at a block 722 (680 in FIG. 6), where 27/256 is the average between 7/64 and 13/128, resulting in a comparator output of "1" (682 in FIG. 6). Control is transferred to a block 724 (4<4) transfers control to 720 and the algorithm concludes at 730 at which point the value of Vi has been converted to binary code 1011.

FIG. 7B illustrates the generating equations 762 and 764 which are used to determine the number of capacitors "$N_b$" for a number of bits "b" that a sub-array of a LCACA is designed to output. Column 730 shows the results for equations 762 and 764 over the range $2 \leq b \leq 12$. The total number of capacitors in the local charge averaging capacitor array (LCACA) is 2N as shown at column 754. In addition, the generating equations are given for $K_n(b)$ which are the coefficients, i.e., K1, K2, etc. used in the Algorithm of FIG. 7A for the number of bits "b" that the LCACA is designed to output. Note that in 766 and 768, index n applies to the cycle number implemented by the Algorithm. The number of cycles implemented by the Algorithm will also be equal to the number of bits b (column 752) that the LCACA is designed to output. The "Round" function rounds the argument of the function up to the next integer value, for example Round(1.5) returns a value 2.

Figure 8:
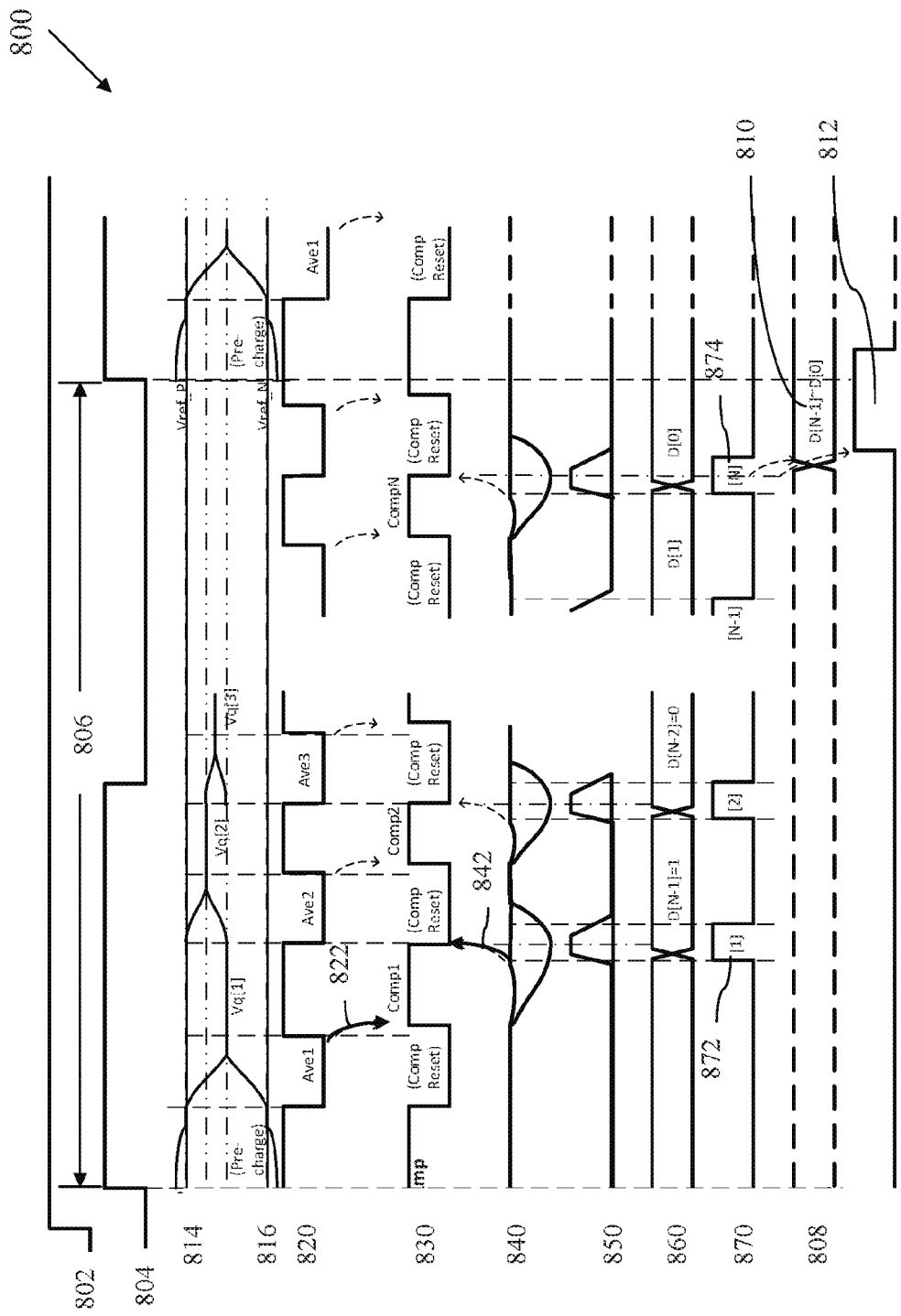
FIG. 8 illustrates a timing diagram for circuits implementing a LCACA, according to embodiments of the invention.

FIG. 8 illustrates, generally at 800, a timing diagram for circuits implementing a LCACA, according to embodiments of the invention. With reference to FIG. 8 the timing diagram presents a series of signals and their relevant states that occur during a conversion of an analog signal to a digital signal in an ADC which results in an N-bit digital word when the ADC implements a LCACA according to embodiments presented herein. An enable signal is indicated at 802, which when high indicates the ADC is active. An external sampling clock signal is indicated at 804 with period indicated at 806. The N-bit digital word is digitized during the sampling interval 806. During the N cycles necessary to construct the N-bit digital word latch signals are shown at 860 and the bits are successively accumulating in the output register 808 and at the end of N cycles are available at 810 for output. End of conversion signal is indicated at 812.

An internal clock signal is generated using contributions from an "averaging done signal" and a "comparison done signal" from the comparator. At the start of the process, two sub-arrays of a capacitor array from a LCACA are pre-charged to two different reference voltages. This is indicated by 814 (one reference voltage) and 816 (a second reference voltage). Switches are adjusted as previously described in conjunction with the preceding figures where charge is averaged across a subset of capacitors in the respective right and left sub-arrays of the LCACA. An "averaging replica circuit" responsive to the capacitive array charging state, is used to create an averaging done signal at 820. The "averaging replica circuit" provides an edge trigger to enable the comparator to go to latch mode. An averaging done rising edge 822 is used to pull the internal clock signal 830 high.

In one or more embodiments, a sense amplifier is used as a comparator. A sense amplifier has internal signals 840 and comparator output 850. Once the "sense amplifier detector" detects that the sensing and amplification functions have been executed a comparison done signal 842 is used to pull the internal clock signal 830 low. The process described above is configured to alternate between charging the capacitive array, averaging the charge across a subset of the capacitors, comparing the voltage output from the LCACA array with the input analog voltage and then repeating N times to complete the conversion of the analog signal to digital signal bit-by-bit for N bits. After each comparison, the next bit, i.e. n+1, in the charge averaging process, is based on the direction determined by comparison of Vi and Vq(n) as described above in conjunction with FIG. 5 through FIG. 7B.

Accordingly, an internal clock is generated as described above with contributions from the "averaging replica circuit" and comparator. This internal clock signal is provided as the clock input at 308 (FIG. 3) or 408 (FIG. 4) and elsewhere in the figures that follow where the triangular clock icon is used in those figures. Comparison done signals are indicated at 870, by 872 through 874.

Figure 9:
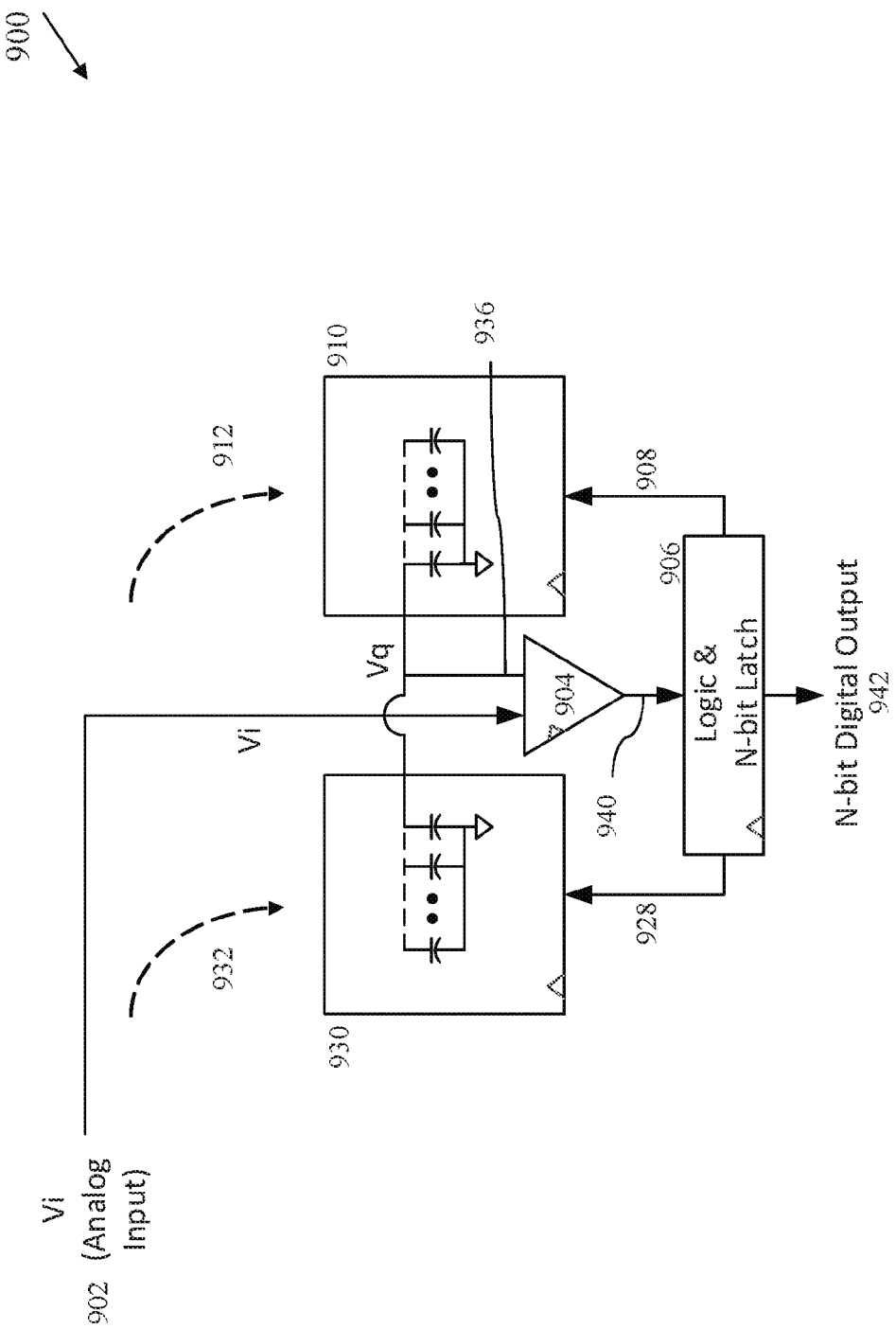
FIG. 9 illustrates 1-level ADC architecture utilizing a LCACA, according to embodiments of the invention.

The LCACA analog-to-digital converter and LCACA algorithm described in the previous figures can be applied in different ADC architectures. FIG. 9 illustrates, generally at 900, 1-level ADC architecture utilizing a LCACA, according to embodiments of the invention. With reference to FIG. 9, a LCACA is configured with a left sub-array 930 which is charged to a first reference voltage indicated as 932 in the figure and a right sub-array 910 which is pre-charged to a different reference voltage indicated as 912 in the figure. 932 is the voltage that represents full scale for the ADC. An analog signal 902 is input into a comparator 904. An output from the LCACA capacitor array 930/910 is input at 936 into the comparator 904. Input 936 provides Vq after each averaging cycle. Logic/latch block 906 provides control signals 908 and 928 to the right sub-array 910 and to the left sub-array 930 as previously described. An output 940 from the comparator 904 is input into logic/latch block 906. As previously described the LCACA ADC is configured to provide a digital output of N-bits at 942.

Operation is as described with respect to the previous figures with pre-charge of the LCACA followed by averaging, comparing, and repeat for N cycle until the digital conversion has concluded. In the case of 1-level architecture, the N-bit digital output is obtained with the LCACA array typically being pre-charged with one of the two arrays being pre-charged to a first reference voltage, i.e., Vref (the high potential) and the other sub-array being pre-charged to a second reference voltage such as Vref2 (the low potential). Vref2 does not need to be 0. Vref and 0 are used for illustration in this description of embodiments no limitation is implied thereby. In addition, either the right or left sub-array can be used for pre-charging to the high potential and either the right or left sub-array can be used for pre-charging to the low potential. In either case one sub-array is pre-charged to one potential and the other sub-array is pre-charged to the other potential the only requirement is that the two potentials are different potentials.

An internal clock is supplied to 910, 930 904 and 906 as indicated by the triangular icon located on each circuit element. The internal clock is developed as described above in conjunction with FIG. 8 and is indicated at 830 in FIG. 8.

In various embodiments, the circuit shown in FIG. 9 at 900 is implemented in an integrated circuit device, which may include an integrated circuit package containing the integrated circuit. In some embodiments, the circuit(s) is implemented in a single integrated circuit die. In other embodiments, the circuit(s) is implemented in more than one integrated circuit die of an integrated circuit device which may include a multi-chip package containing the integrated circuit. The embodiments of the present invention are not limited to any particular semiconductor manufacturing technology. Embodiments of the present invention can be implemented using C-MOS, BIPOLAR, Silicon Germanium, or other process technology. The process technologies listed here are provided merely for example and do not limit embodiments of the invention.

Figure 10:
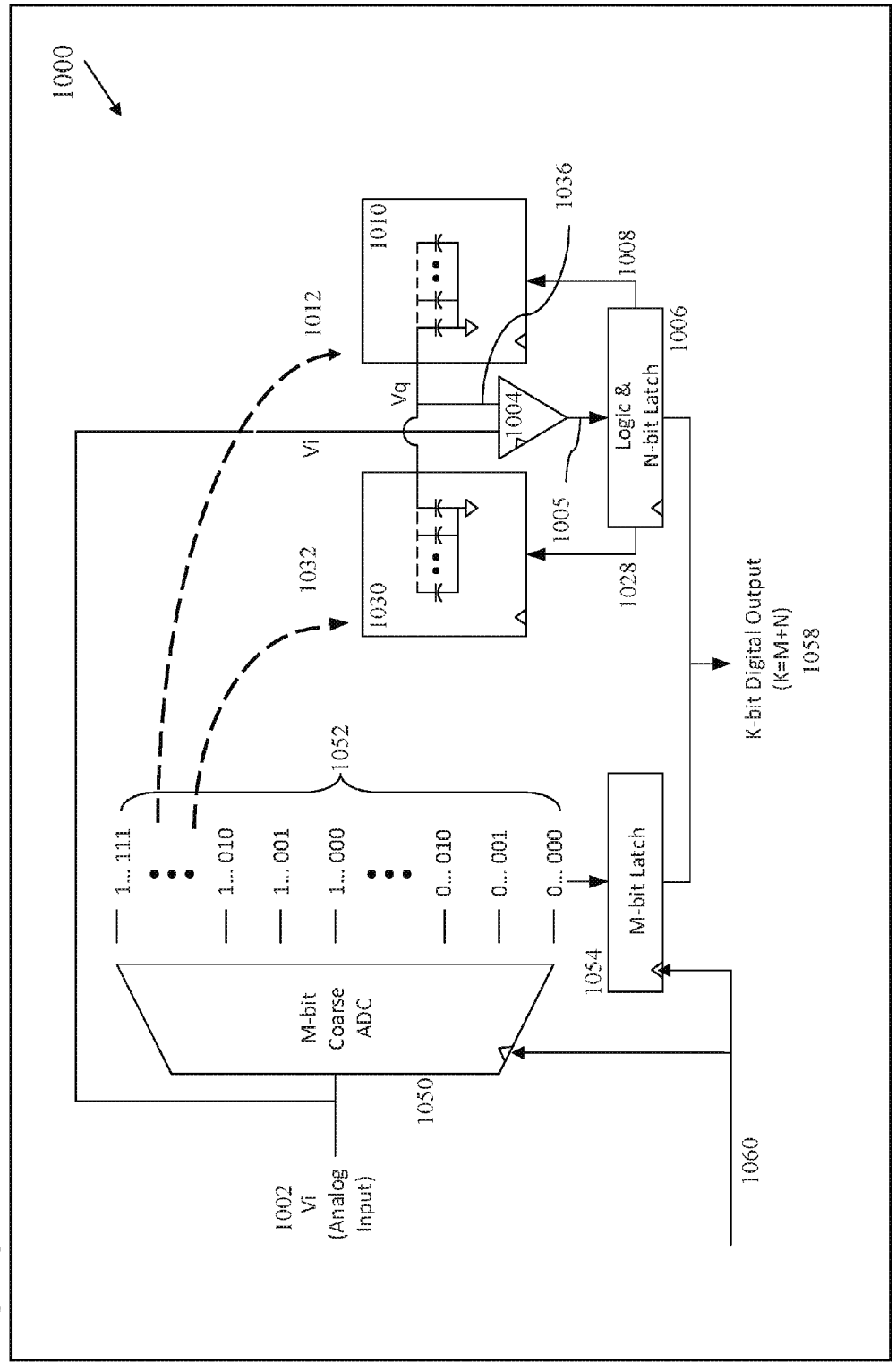
FIG. 10 illustrates full range mode with 2-level ADC architecture utilizing a LCACA, according to embodiments of the invention.

FIG. 10 illustrates, generally at 1000, full range mode with 2-level ADC architecture utilizing a LCACA, according to embodiments of the invention. With reference to FIG. 10, a coarse M-bit ADC is configured with a LCACA ADC which functions as a fine ADC. The LCACA fine ADC provides another N-bits of quantization for a total of L bits where L=M+N. A difference between the two pre-charge levels in the LCACA will be a fraction of the full scale range of the coarse ADC. As an example, in one embodiment, an M-bit coarse ADC is shown at 1050. The M-bit coarse ADC quantizes the analog input signal 1002 into $2^M$ bins (or sections) indicated at 1052. The M-bit coarse ADC 1050 provides the first M most significant bits which are held by the M-bit latch 1054. External clock 1060 provides a clock signal to the coarse ADC and the M-bit latch 1054. In one or more embodiments the sampling clock 804 (FIG. 8) can be used to derive the external clock 1060. The sampling clock 1060 operates at a lower frequency than does the internal clock.

The analog signal 1002 is also input into a comparator 1004. The comparator 1004 is configured with a left sub-array 1030 and a right sub-array 1010 of a LCACA which is configured to digitize the residue of the coarse ADC into N bits. The N-bit logic/latch block 1006 outputs control signals at 1028 into the left sub-array 1030 and control signals 1008 into the right sub-array 1010. An output 1036 of the LCACA (1030/1010) is input into the comparator at 1036 for comparison with the input analog signal 1002. An output 1005 of the comparator 1004 is input into an N-bit logic/latch block 1006.

In various embodiments, the circuit shown in FIG. 10 at 1000 is implemented in an integrated circuit device, which may include an integrated circuit package containing the integrated circuit. In some embodiments, the circuit(s) is implemented in a single integrated circuit die. In other embodiments, the circuit(s) is implemented in more than one integrated circuit die of an integrated circuit device which may include a multi-chip package containing the integrated circuit. The embodiments of the present invention are not limited to any particular semiconductor manufacturing technology. Embodiments of the present invention can be implemented using C-MOS, BIPOLAR, Silicon Germanium, or other process technology. The process technologies listed here are provided merely for example and do not limit embodiments of the invention.

As described above, the M-bit coarse ADC splits the full range (FR) of the input signal into $2^M$ sections. The amplitude of each section is $FR/2^M$. After the M-bit coarse ADC quantizes the analog input 1002, the output bin (alternatively referred to herein as "section") is known and the upper voltage reference is $(K+1)/2^M \times Vref$. The lower voltage reference is also known and it is $K/2^M \times Vref$. These upper and lower voltage references 1032 and 1012 are passed to the sub-arrays 1030 and 1010. The LCACA fine ADC processes the analog input 1002 N times as described above to obtain the digital conversion of the analog input with respect to the upper reference voltage range of $(K+1)/2^M \times Vref$ and the lower voltage reference of $K/2^M \times Vref$. An output of the N-bit logic and latch block 1006 is combined with an output from the M-bit latch 1054 to from an L-bit wide digital word as described above where L=M+N which is output at 1058.

Real circuits and components used therein have values such as capacitance which vary because of engineering tolerances. As such, the values of components used to make the right sub-array will not be exactly the same as the values of the components used to make the left sub-array. Because of these tolerances, if the system always assigns a MSB sub-array to pre-charge to a value of $[(r+1) \times Vref/2^M]$ and assign the other sub-array to pre-charge to a value of $[r \times Vref/2^M]$ then there will be a sub-section jump gap or sub-section non-monotonic overlap due to the mismatches previously described.

To alleviate the possibility of non-monotonic behavior in the ADC output the pre-charge values $[2i \times Vref/2^M]$ are assigned to the even sub-array and the $[(2i+1) \times Vref/2^M]$ pre-charge values are assigned to the odd sub-array and the most significant bit (MSB) indicator direction is toward the odd sub-array, where i is in the range from 1 to $2^{M-1}$. Odd and even refer to the section number.

The pre-charge values $[2j \times Vref/2^M]$ are assigned to the even sub-array and the pre-charge values $[(2j-1) \times Vref/2^M]$ are assigned to the odd sub-array. Here the most significant bit (MSB) indicator direction is swapped toward the even sub-array, where j is in the range 0 to $2^{M-1}-1$.

Following this method, a predefined order according to section number is established such that pre-charge values $[2k \times Vref/2^M]$ are always assigned to the even sub-array no matter if the $[2k \times Vref/2^M]$ pre-charge value is being used with $[(2k-1) \times Vref/2^M]$ or $[(2k+1) \times Vref/2^M]$ in a given section. Thus, the gap or overlap is eliminated.

Figure 11A:
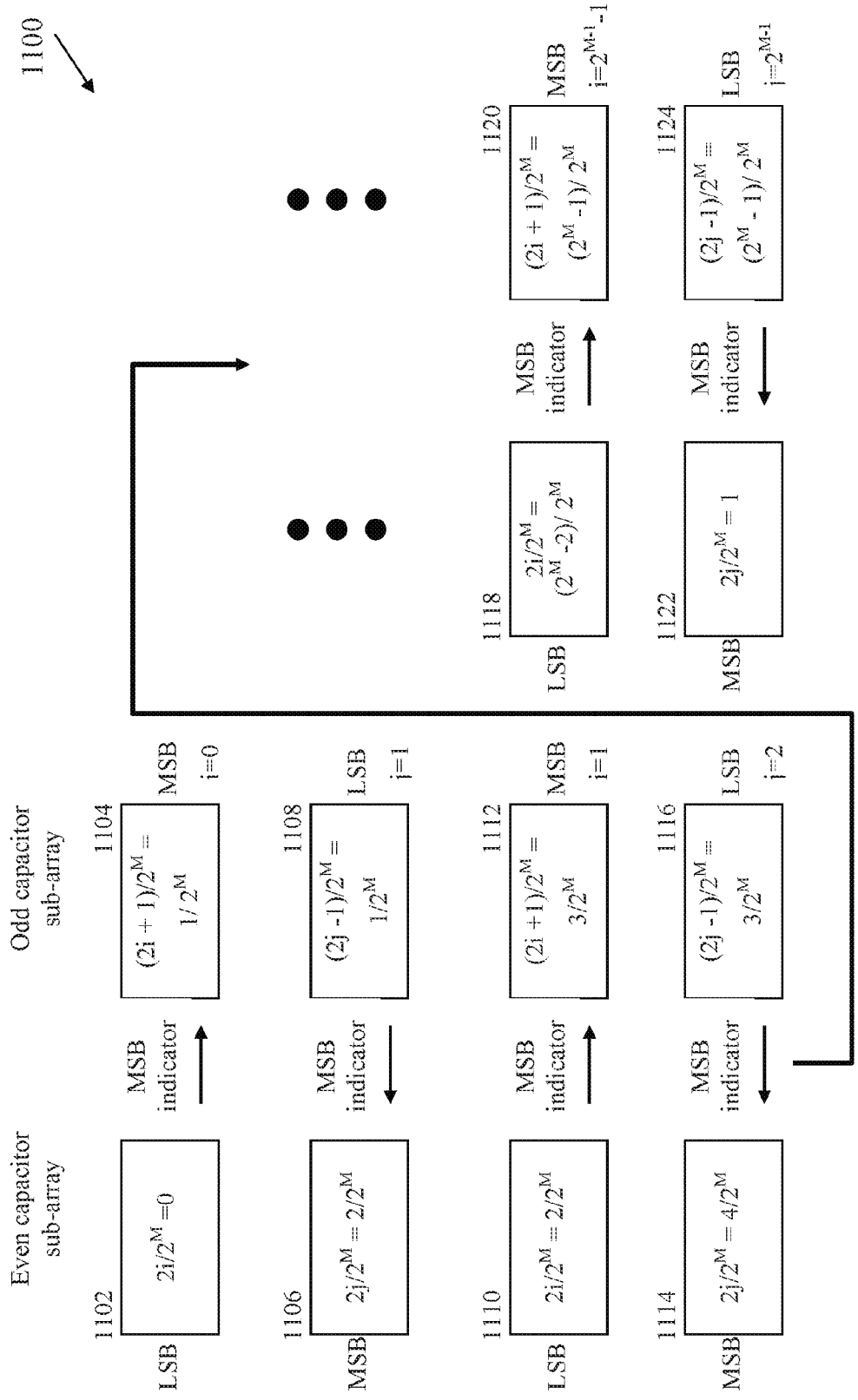
FIG. 11A illustrates Gap-less pre-charge most significant bit (MSB) direction capacitive array swapping, according to embodiments of the invention.

An example of the discussion above is illustrated in FIG. 11A where the even sub-array is on the left and the odd sub-array is on the right. FIG. 11A illustrates, generally at 1100, Gap-less pre-charge most significant bit (MSB) direction capacitive array swapping, according to embodiments of the invention. Referring to FIG. 11A, sub-array 1102 is pre-charged to 0, sub-array 1104 is pre-charged to $1/2^M$ with the MSB indicator pointing to the right. When the sub-arrays are pre-charged at the next section up the amplitude scale, (indicated by 1106/1108) the right sub-array 1108 is pre-charged to the same voltage $1/2^M$ with the MSB indicator pointing to the left. The left sub-array 1106 is pre-charged to the higher reference voltage of $2/2^M$. Moving up the through the amplitude range of the sections, sub-array 1110 is pre-charged to same value that is was previously at $2/2^M$ 1106 and right sub-array is pre-charged to $3/2^M$ at 1112 with the MSB indicator direction pointing to the right. This process continues with the MSB indicator direction being swapped at the next step up the voltage scale as shown between 1116 and 1114. The MSB indicator is swapped again between 1118 and 1120 and finally between 1124 and 1122. Note that the "even" sub-arrays 1102, 1106, 1110, 1114, 1118, and 1122 indicate for example the left sub-array and the "odd" sub-arrays 1104, 1108, 1112, 1116, 1120, and 1124 indicate the right sub-array. Alternatively, the convention can be exchanged. The result is that the pre-charge voltages currently assigned as even can be used on the right sub-array and the pre-charge voltages currently assigned as odd can be used on the left sub-array. Examples of this are shown in FIG. 11B and FIG. 11C below.

Figure 11B:
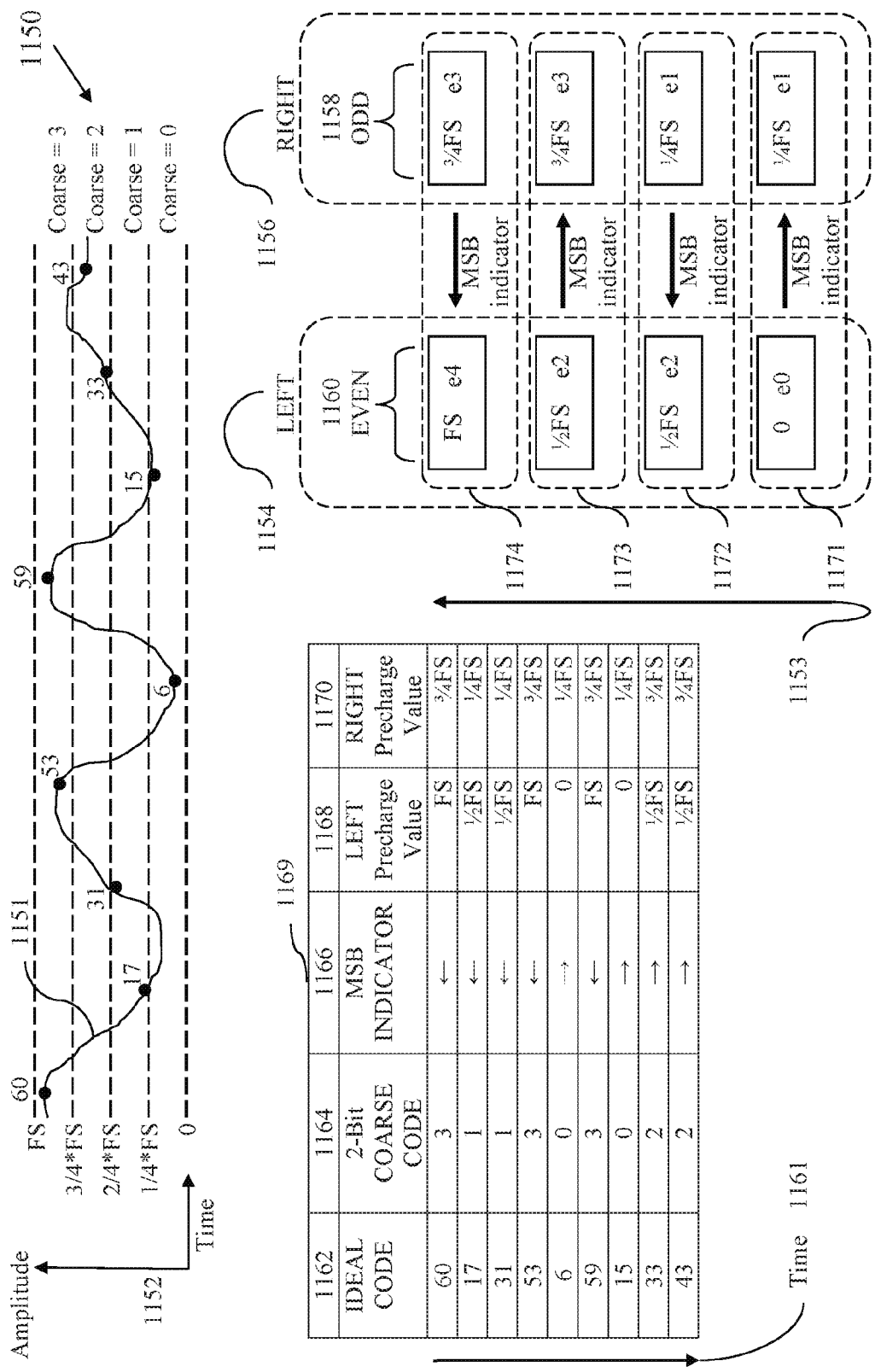
FIG. 11B illustrates Gap-less pre-charge most significant bit (MSB) direction capacitive array swapping with a 2-bit (M=2) coarse ADC example, according to embodiments of the invention.

FIG. 11B illustrates Gap-less pre-charge most significant bit (MSB) direction capacitive array swapping with a 3-bit (M=3) coarse ADC example, according to embodiments of the invention. With reference to FIG. 11B, a voltage range for an input analog signal 1151 as a function of amplitude and time (axes 1152) is indicated at 1150 where the low end of the amplitude range is indicated at 0 and the high end of the amplitude range (full scale) is indicated at FS.

The full scale range is divided into 4 sections with a coarse ADC having 2 bits of quantization where $4=2^2$. Each section or segment is numbered as follows; Coarse=0, Coarse=1, Coarse=2, and Coarse=3 and represents increasing amplitude of the input signal 1151 against the amplitude axis 1152. Points 60, 17, 31, 53, 6, 59, 15, 33, and 43 represent the ideal value of the analog signal 1151 at the corresponding points in time shown.

Charging sub-arrays of a LCACA according to a predefined order based on increasing section number is shown for a left sub-array 1154 and a right sub-array 1156 as a function of amplitude of the input analog signal 1153. According to the predefined order illustrated here, odd section numbers 1158 are assigned to the right sub-array 1154 and even section numbers 1160 are assigned to the left sub-array 1156, thereby setting a most significant bit (MSB) direction as indicated with the arrow for each section. The section that processes the lowest amplitude signals (Coarse=0) is indicated at 1171 and pre-charges the left sub-array to 0 (LSB sub-array) and the right sub-array to ¼ FS (MSB sub-array). The section that processes the next increment up in amplitude (Coarse=1) is indicated at 1172 and pre-charges the right sub-array to ¼ FS (LSB sub-array) and the left sub-array to ½FS (MSB sub-array). The section that processes the next increment up in amplitude (Coarse=2) is indicated at 1173 and pre-charges the left sub-array to ½FS (LSB sub-array) and the right sub-array to ¾FS (MSB sub-array). Lastly, the section that processes the last increment up in amplitude (Coarse=3) is indicated at 1174 and pre-charges the right sub-array to ¾FS (LSB sub-array) and the left sub-array to FS (MSB sub-array). Thus, the pre-charge values for a given sub-array depend on a section number that is associated with the analog signal passed to the ADC for processing and a predefined order for pre-charging the sub-arrays of the LCACA is established.

Table 1169 tabulates each of the samples from 1151, with time increasing as shown with an arrow 1161. For a given row in table 1169 a column 1162 (IDEAL CODE) tabulates the ideal value for a sample of the analog signal. A column 1164 (2-Bit COARSE CODE) shows a corresponding section number where the value from column 1162 will fall based on quantization of its amplitude by the 2-bit coarse ADC. A column 1166 indicates a direction of the most significant bit (MSB) for the given section. A column 1168 indicates a pre-charge value for the left sub-array of the LCACA and a column 1170 indicates a pre-charge value for the right sub-array of the LCACA according to the predefined order previously discussed.

The MSB direction arrow changes direction with each increment up the voltage range from 0 to FS section by section from 1171 to 1172 to 1173 to 1174. Voltage error in a given sub-array is a function of pre-charge voltage. Voltage error for a given pre-charge value is indicated by e# where e0 indicates the error associated with pre-charging to value 0, e1 indicates error associated with pre-charge to value ¼FS, etc. Note that the MSB/LSB array swapping ensures that the a particular reference voltage is always applied to the same physical sub-array regardless of whether that sub-array is in an LSB position or an MSB position in different sections. For example, reference voltage ¼FS is always applied to the right sub-array in both sections 1171 (MSB position) and 1172 (LSB position). Therefore, the MSB/LSB array swapping, described above, provides a monotonically increasing ADC output.

FIG. 11C illustrates Gap-less pre-charge most significant bit (MSB) direction capacitive array swapping with a 2-bit (M=2) coarse ADC example, according to further embodiments of the invention. Referring to FIG. 11C, left and right sub-arrays of an LCACA are pre-charged according to a different pre-defined order.

Charging sub-arrays of a LCACA according to another predefined order based on increasing section number is shown for the left sub-array 1154 and the right sub-array 1156 (from FIG. 11B) as a function of amplitude of the input analog signal 1153. According to the predefined order illustrated here, odd section numbers 1158 are assigned to the left sub-array 1154 and even section numbers 1160 are assigned to the right sub-array 1156, thereby setting a most significant bit (MSB) direction as indicated with the arrow. The section that processes the lowest amplitude signals (Coarse=0) is indicated at 1171 and pre-charges the right sub-array to 0 (LSB sub-array) and the left sub-array to ¼FS (MSB sub-array). The section that processes the next increment up in amplitude (Coarse=1) is indicated at 1172 and pre-charges the left sub-array to ¼FS (LSB sub-array) and the right sub-array to ½FS (MSB sub-array). The section that processes the next increment up in amplitude (Coarse=2) is indicated at 1173 and pre-charges the right sub-array to ½FS (LSB sub-array) and the left sub-array to ¾FS (MSB sub-array). Lastly, the section that processes the next increment up in amplitude (Coarse=3) is indicated at 1174 and pre-charges the left sub-array to ¾FS (LSB sub-array) and the right sub-array to FS (MSB sub-array). Thus, as before the pre-charge values for a given sub-array depend on a section number that is associated with the analog signal passed to the ADC for processing and another predefined order for pre-charging the sub-arrays of the LCACA is established.

Table 1169 tabulates each of the samples from 1151, with time increasing as shown with an arrow 1161. For a given row in table 1169 a column 1162 (IDEAL CODE) tabulates the ideal value for a sample of the analog signal. A column 1164 (2-Bit COARSE CODE) shows a corresponding section number where that point will fall based on quantization of its amplitude by the 2-bit coarse ADC. A column 1190 indicates a direction of the most significant bit (MSB) for the given section. A column 1192 indicates a pre-charge value for the left sub-array of the LCACA and a column 1194 indicates a pre-charge value for the right sub-array of the LCACA according to the pre-defined order previously discussed.

As before, the MSB direction arrow changes direction with each increment up the voltage range from 0 to FS section by section from 1171 to 1172 to 1173 to 1174. Voltage error in a given sub-array is a function of pre-charge voltage. Voltage error for a given pre-charge value is indicated by e# where e0 indicates the error associated with pre-charging to value 0; e1 indicates error associated with pre-charge to value ¼FS, etc. Note that the MSB/LSB array swapping ensures that the a particular reference voltage is always applied to the same physical sub-array regardless of whether that sub-array is in an LSB position or an MSB position in different sections. For example, reference voltage ¼FS is always applied to the left sub-array in both sections 1171 (MSB position) and 1172 (LSB position). Therefore, the MSB/LSB array swapping, described above, provides a monotonically increasing ADC output. Note that in various embodiments, the predefined order in FIG. 11C is reversed from the predefined order of FIG. 11B however both predefined orders will permit the fine ADC to quantize the residue of the coarse ADC in the same way. Therefore, the same ADC output is obtained from either predefined order. Once a predefined order is established for a given system design it must be followed in order to maintain a monotonic output for the ADC.

Figure 12:
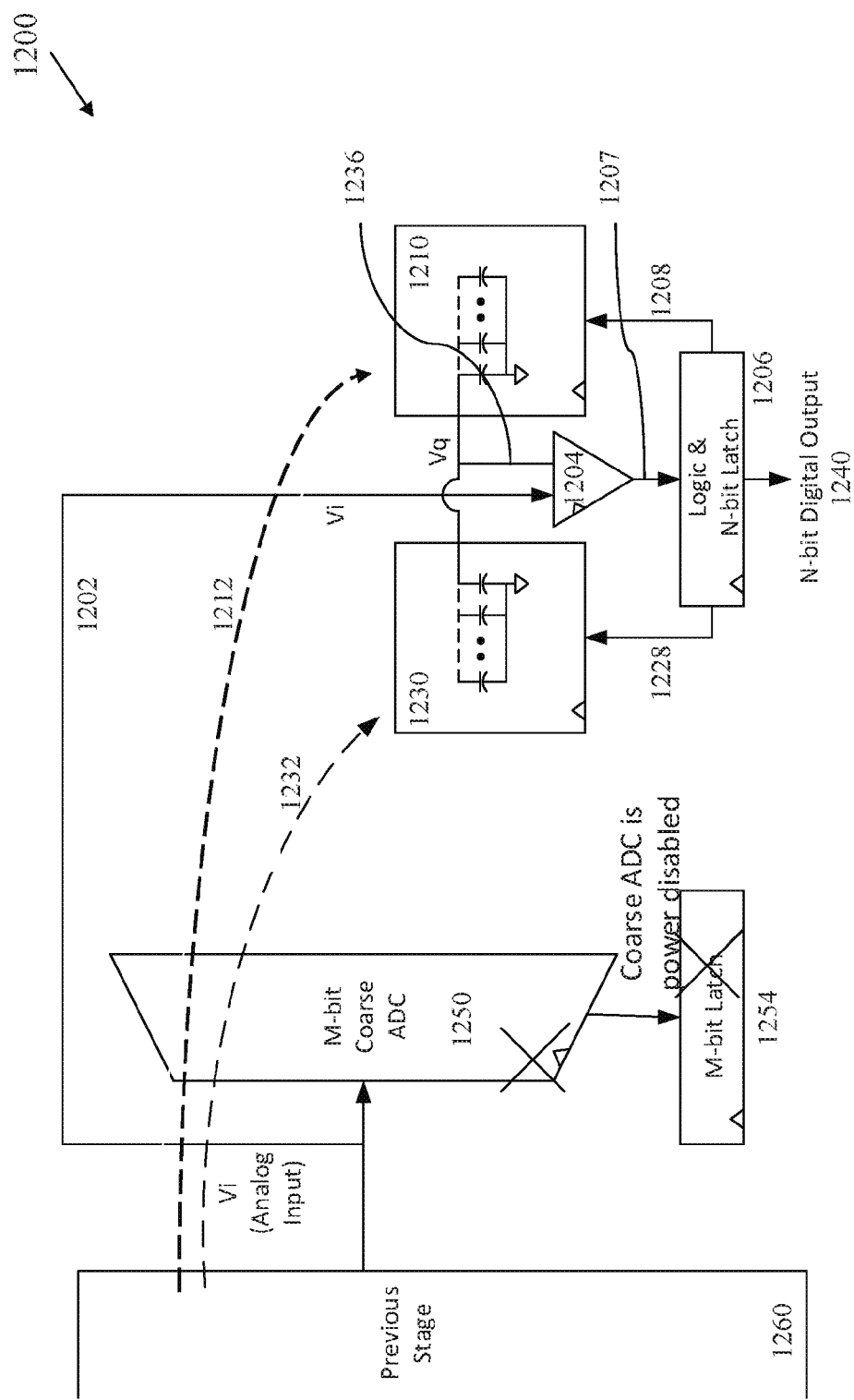
FIG. 12 illustrates sub-range mode with 2-level ADC architecture utilizing a LCACA, according to embodiments of the invention.

FIG. 12 illustrates, generally at 1200, sub-range mode with 2-level ADC architecture utilizing a LCACA, according to embodiments of the invention. With reference to FIG. 12, an analog input signal 1202 is input into a comparator 1204. A logic and N-bit latch block 1206 receives an output 1207 from the comparator 1204. The logic and N-bit latch block 1206 provides control signals 1228 to a first sub-array 1230 of a LCACA ADC and control signals 1208 to a second sub-array 1210 of the LCACA ADC.

In sub-range mode, the M-bit coarse ADC 1250 and the M-bit latch 1254 are disabled. Fractional pre-charge levels 1232 and 1212 are provided from a previous stage 1260 to the sub-array 1230 and the sub-array 1210. An output 1236 of the LCACA (1230/1210) is input into the comparator at 1236 for comparison with the input analog signal 1202. An N-bit digital output is provided at 1240 which represents the digital conversion of the analog signal 1202.

In various embodiments, the LCACA is implemented in an integrated circuit device, which may include an integrated circuit package containing the integrated circuit. In some embodiments, the circuit shown in 1200 is implemented in a single integrated circuit die. In other embodiments, the circuit shown in 1200 is implemented in more than one integrated circuit die of an integrated circuit device which may include a multi-chip package containing the integrated circuit. The embodiments of the present invention are not limited to any particular semiconductor manufacturing technology. Embodiments of the present invention can be implemented using C-MOS, BIPOLAR, Silicon Germanium, or other process technology. The process technologies listed here are provided merely for example and do not limit embodiments of the invention.

In various embodiments, integrated circuits and methods (processes) have been described to create a LCACA DAC. Such embodiments are used to convert analog signals to digital signals in electronic devices such as computers, mobile phones, network equipment, communication channels that implement communication protocols such as Bluetooth (IEEE 802.15), Ethernet (IEEE 802.3 standard), Universal Serial bus (USB,) High Definition Multimedia Interface (HDMI,) IEEE 1394 standard (known as the Apple, Inc. product Firewire®), etc. These examples are provided merely for illustration and are not meant to limit application of embodiments of the present invention. Embodiments, of the present invention are readily employed wherever analog-to-digital conversion is required.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

Any of the methods according to the present invention can be implemented in hard-wired circuitry (e.g., integrated circuit(s)), by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods herein may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Non-transitory machine-readable media is understood to include any mechanism for storing information in a form readable by a machine (e.g., a computer). For example, a machine-readable medium, synonymously referred to as a computer-readable medium, includes read only memory (ROM); random access memory (RAM); magnetic disk storage media; optical storage media; flash memory devices; except electrical, optical, acoustical or other forms of transmitting information via propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
 a comparator, the comparator is configured with a first high input, a first low input, and is configure to receive a clock signal;
 a logic/latch block, the logic/latch block is configured to receive the clock signal and an output from the comparator, the logic/latch block is configured to output a control signal and a digital N-bit output signal; and
 a first local charge-averaging capacitor array (LCACA), the first LCACA is configured to receive the control signal and a reference voltage, an output of the first LCACA is coupled to the first low input, the first LCACA is divided into a high sub-array and a low sub-array, the high sub-array to be pre-charged to a high reference voltage and the low sub-array to be pre-charged to a low reference voltage, the high reference voltage is greater than the low reference voltage, wherein in operation an analog signal is input to the first high input and the digital N-bit output signal is the digital conversion of the analog signal.

2. The apparatus of claim 1, wherein the logic/latch block is operable to provide control signals to the first LCACA array and to compute a comparison voltage (Vq) for N cycles before outputting the digital N-bit output signal.

3. The apparatus of claim 1, wherein the clock signal is an internal clock signal formed using a replica circuit of an LCACA charging state and an internal signal from the comparator.

4. The apparatus of claim 1, wherein the LCACA is structured according to a number of bits "b" required in the analog-to-digital conversion as follows:

$b=2, N_2=2;$ $b>2, N_b=N_{b-1}+\text{Round}(N_{b-1}/2);$ $n=1, K_1(b)=\text{Round}(N_{b-1}/2);$ and $n>1, K_n(b)=K_{n-1}(b-1).$ 5. The apparatus of claim 1, wherein the comparator is configured with a differential input, the comparator further comprising:
   a second high input and a second low input, wherein an analog differential signal is input to the first high input and the second low input; and
   a second local charge-averaging capacitor array (LCACA), the second LCACA is configured to receive a second control signal from the logic/latch block and a second reference voltage, an output of the second LCACA is coupled to the second high input, wherein in operation the analog differential signal is input to the comparator and the digital N-bit output signal is a digital conversion of the analog differential signal.

6. The apparatus of claim 1, wherein the clock signal is configured to sample the analog input signal at a frequency sufficient to satisfy the Nyquist condition.

7. The apparatus of claim 1, wherein the clock signal is designed to sample the analog input signal at a frequency below the Nyquist condition.

8. The apparatus of claim 1, wherein the clock signal is sufficiently high to accommodate a bandwidth of multiple Giga-hertz for the analog input signal.

9. An apparatus comprising:
   an M-bit analog-to-digital converter (ADC), the M-Bit ADC is configured to receive an input analog signal and to assign the input analog signal to a first section of an M-bit digital output signal having $2^M$ sections, a residue voltage and at least one reference voltage;
   an N-bit analog-to-digital converter (ADC), the N-bit ADC is configured to receive as an input the residue voltage and the at least one reference voltage, the N-bit ADC converter further comprising:
      a comparator, the comparator is configured to receive the output signal on a first high input, the comparator has a first low input, and the comparator is configure to receive a clock signal;
      a logic/latch block, the logic/latch block is configured to receive the clock signal and an output signal from the comparator, the logic/latch block is configured to output a control signal and a digital N-bit output signal; and
      a local charge-averaging capacitor array (LCACA), the LCACA is configured to receive the residue voltage and the at least one reference voltage, an output signal of the LCACA is coupled to the first low input, the LCACA is divided into a left sub-array and a right sub-array, the left sub-array and the right sub-array are pre-charged to different voltages in a pre-defined order according to section number, wherein in operation the output signal of the LCACA is input on the first high input and the digital conversion of the analog signal contains M+N bits.

10. The apparatus of claim 9, wherein in sub-ranging mode the M-bit ADC is disabled, the input to the N-bit ADC and the reference voltages are provided by a previous stage.

11. The apparatus of claim 9, wherein the clock signal is an internal clock signal formed using a replica circuit of the LCACA charging state and an internal signal from the comparator.

12. The apparatus of claim 9, wherein a sense amplifier is used in the comparator.

13. A method for converting an input analog signal to digital comprising:
   pre-charging a least significant bit (LSB) sub-array of a local charge-averaging capacitor array (LCACA) to a first voltage;
   pre-charging a most significant bit (MSB) sub-array of the local charge-averaging capacitor array (LCACA) to a second voltage, wherein the second voltage is greater than the first voltage;
   selecting a first number of capacitors from the LCACA to produce an average voltage;
   analyzing an output of a comparator in response to the average voltage; and
   repeating the steps of selecting a number of capacitors from the LCACA and analyzing an output of a comparator to identify a digital output representative of a voltage of the input analog signal.

14. The method of claim 13 wherein the steps of selecting a number of capacitors from the LCACA to produce an average voltage, analyzing an output of a comparator in response to the average voltage, and repeating the steps of selecting a number of capacitors from the LCACA and analyzing an output of a comparator to identify a digital output representative of the voltage of the input analog signal further comprise:
   combining in parallel K1 capacitors [CH(0)~CH(K1)] from the MSB sub-array and K1 capacitors [CL(0)~CL(1)] from the LSB sub-array to obtain Vq(n) for n=1;
   testing A (if Vi>Vq(n)) then
      (yes or 1) n=n+1,
         C_min(n)=CH(K1−K2)
         C_max(n)=CH(K1+K2−1)
         combine in parallel C_min(n)~C_max(n) to obtain Vq(n)
         GO TO Testing B
      (no or 0) n=n+1
         C_min(n)=CL(K1−K2)
         C_max(n)=CL(K1+K2−1)
         combine in parallel C_min(n)~C_max(n) to obtain Vq(n)
   testing B (if Vi>Vq(n)) then
      (yes or 1) if n>N then
         (yes or 1) END
         (no or 0) n=n+1
            C_min(n)=C_max(n−1)+1−K(n)
            C_max(n)=C_max(n−1)+K(n)
            combine in parallel C_min(n)~C_max(n) to obtain Vq(n)
            GO TO testing B
      (no or 0) if n>N then
         (yes or 1) END
         (no or 0) n=n+1
            C_min(n)=C_min(n−1)−K(n)

C_max(n)=C_min(n−1)−1+K(n)
combine in parallel C_min(n)~C_max(n) to obtain Vq(n)
GO TO testing B.

15. The method of claim 14, wherein Vi is output from a separate M-bit analog-to-digital converter (ADC).

16. The method of claim 14, wherein Vi is output from a previous stage.

17. A logic implemented in an integrated circuit, the logic to convert an input analog signal to digital, the logic comprising:
pre-charging means for pre-charging a least significant bit (LSB) sub-array of a local charge-averaging capacitor array (LCACA) to a first voltage and for pre-charging a most significant bit (MSB) sub-array of the local charge-averaging capacitor array (LCACA) to a second voltage, wherein the second voltage is greater than the first voltage;
means for selecting a first number of capacitors from the LCACA to produce an average voltage;
means for analyzing an output of a comparator in response to the average voltage; and
means for determining whether to repeat the selecting with a second number of capacitors and the analyzing an output of the comparator.

18. The logic of claim 17, further comprising:
means for ordering a most significant bit (MSB) direction in the LCACA as a function of section number associated with the input analog signal; and
means for producing a digital output from the LCACA.

19. The logic of claim 17, further comprising:
means for creating an internal clock with a replica circuit of an LCACA charging state and an internal signal from the comparator.

20. The logic of claim 19, wherein the internal clock signal is sufficiently high to accommodate a bandwidth of multiple Giga-hertz for the input analog signal.

* * * * *